(12) United States Patent
Saito et al.

(10) Patent No.: US 10,622,285 B2
(45) Date of Patent: Apr. 14, 2020

(54) SEMICONDUCTOR DEVICE WITH SOLDERS OF DIFFERENT MELTING POINTS AND METHOD OF MANUFACTURING

(71) Applicant: ROHM CO., LTD., Kyoto-shi, Kyoto (JP)

(72) Inventors: Koshun Saito, Kyoto (JP); Katsuhiro Iwai, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/643,159

(22) Filed: Jul. 6, 2017

(65) Prior Publication Data
US 2018/0012826 A1 Jan. 11, 2018

(30) Foreign Application Priority Data

| Jul. 8, 2016 | (JP) | 2016-135582 |
| Jul. 8, 2016 | (JP) | 2016-135583 |
| Jun. 29, 2017 | (JP) | 2017-127342 |

(51) Int. Cl.
*H01L 23/495* (2006.01)
*H01L 23/31* (2006.01)
(Continued)

(52) U.S. Cl.
CPC .... *H01L 23/49513* (2013.01); *H01L 21/4825* (2013.01); *H01L 21/561* (2013.01); *H01L 21/565* (2013.01); *H01L 23/3114* (2013.01); *H01L 23/4952* (2013.01); *H01L 23/49562* (2013.01); *H01L 23/49568* (2013.01); *H01L 23/49575* (2013.01); *H01L 24/29* (2013.01);
(Continued)

(58) Field of Classification Search
CPC ......... H01L 23/49513; H01L 23/49575; H01L 2224/06505; H01L 2224/09505
USPC .......................................... 257/676, 782, 783
See application file for complete search history.

(56) References Cited

U.S. PATENT DOCUMENTS

| 2002/0014704 A1* | 2/2002 | Horie .................. H01L 23/3107 |
| | | 257/779 |
| 2007/0166877 A1* | 7/2007 | Otremba .......... H01L 23/49513 |
| | | 438/106 |

(Continued)

FOREIGN PATENT DOCUMENTS

| JP | 2010-177619 A | 8/2010 |
| JP | 2012-59927 A | 3/2012 |

*Primary Examiner* — Matthew E Warren
(74) *Attorney, Agent, or Firm* — Hamre, Schumann, Mueller & Larson, P.C.

(57) ABSTRACT

An aspect of the present disclosure provides a method of manufacturing a semiconductor device. The method includes: preparing a first semiconductor element and a second semiconductor element, each of the first semiconductor element and the second semiconductor element having an element main surface and an element back surface that face opposite sides to each other; die bonding the element back surface of the first semiconductor element to a pad main surface by using a first solder; and die bonding the element back surface of the second semiconductor element to the pad main surface by using a second solder having a melting point lower than a melting point of the first solder, after die bonding the element back surface of the first semiconductor element to the pad main surface by using the first solder.

9 Claims, 19 Drawing Sheets

(51) Int. Cl.
   *H01L 23/00*   (2006.01)
   *H01L 21/48*   (2006.01)
   *H01L 21/56*   (2006.01)
(52) U.S. Cl.
   CPC .............. *H01L 24/33* (2013.01); *H01L 24/48* (2013.01); *H01L 24/83* (2013.01); *H01L 24/92* (2013.01); *H01L 24/97* (2013.01); H01L 23/3107 (2013.01); H01L 24/06 (2013.01); H01L 24/32 (2013.01); H01L 24/49 (2013.01); H01L 24/73 (2013.01); H01L 2224/05552 (2013.01); H01L 2224/05554 (2013.01); H01L 2224/0603 (2013.01); H01L 2224/06505 (2013.01); H01L 2224/09505 (2013.01); H01L 2224/29111 (2013.01); H01L 2224/32013 (2013.01); H01L 2224/32245 (2013.01); H01L 2224/33505 (2013.01); H01L 2224/45015 (2013.01); H01L 2224/45124 (2013.01); H01L 2224/48245 (2013.01); H01L 2224/48247 (2013.01); H01L 2224/48465 (2013.01); H01L 2224/49113 (2013.01); H01L 2224/49171 (2013.01); H01L 2224/73265 (2013.01); H01L 2224/83815 (2013.01); H01L 2224/83986 (2013.01); H01L 2224/97 (2013.01); H01L 2924/1203 (2013.01); H01L 2924/13055 (2013.01); H01L 2924/13091 (2013.01); H01L 2924/15747 (2013.01); H01L 2924/181 (2013.01); H01L 2924/3512 (2013.01)

(56) References Cited

U.S. PATENT DOCUMENTS

| | | | |
|---|---|---|---|
| 2012/0051381 A1* | 3/2012 | Shimizu | H01S 5/4087 372/50.1 |
| 2016/0126227 A1* | 5/2016 | Bauer | H01L 23/485 257/773 |
| 2017/0018542 A1* | 1/2017 | Seddon | H01L 25/50 |

* cited by examiner

Bonding Strength Resistance
(Change in Limit Cycle Number for Bonding Strength)

Pitting Corrosion Resistance
(Change in Limit Cycle Number for Pitting Corrosion)

SEMICONDUCTOR DEVICE WITH SOLDERS OF DIFFERENT MELTING POINTS AND METHOD OF MANUFACTURING

FIELD

The present disclosure relates to a method of manufacturing a semiconductor device and a semiconductor device.

BACKGROUND

An example of a conventional semiconductor device includes an IGBT chip, a diode chip, and a lead frame. The IGBT chip and the diode chip are mounted on one side of the same lead frame. They are electrically connected to the lead frame via a solder layer, and these chips are fixed by the solder layer.

SUMMARY

A first aspect of the present disclosure provides a method of manufacturing a semiconductor device. The method includes preparing a lead frame. The lead frame includes a first lead including a pad and a first terminal. The pad includes a pad main surface and a pad back surface that face opposite sides to each other in a first direction. The first terminal extends from the pad along a second direction that is perpendicular to the first direction. The method includes: preparing a first semiconductor element and a second semiconductor element, each of the first semiconductor element and the second semiconductor element having an element main surface and an element back surface that face opposite sides to each other; die bonding the element back surface of the first semiconductor element to the pad main surface by using a first solder; and die bonding the element back surface of the second semiconductor element to the pad main surface by using a second solder having a melting point lower than a melting point of the first solder, after die bonding the element back surface of the first semiconductor element to the pad main surface by using the first solder.

A second aspect of the present disclosure provides a semiconductor device. The semiconductor device includes a lead frame, a first semiconductor element and a second semiconductor element, a first solder, and a second solder. The lead frame includes a first lead including a pad and a first terminal. The pad includes a pad main surface and a pad back surface that face opposite sides to each other in a first direction. The first terminal extends from the pad along a second direction that is perpendicular to the first direction. The first semiconductor element and the second semiconductor element each have an element main surface and an element back surface that face opposite sides to each other in the first direction. The element back surface of the first semiconductor element and the element back surface of the second semiconductor element face the pad main surface. The first solder is provided between the first semiconductor element and the pad main surface and provides conductive bonding between the first semiconductor element and the pad. The second solder is provided between the second semiconductor element and the pad main surface, provides conductive bonding between the second semiconductor element and the pad, and has a melting point lower than a melting point of the first solder.

Another aspect of the present disclosure provides a semiconductor device. The semiconductor device includes: a semiconductor element; an external electrode; and a wire. The wire provides electrical conduction between the semiconductor element and the external electrode. The wire has an average crystal grain size of 3 μm to 15 μm.

DRAWINGS

EMBODIMENTS

Figure 1:
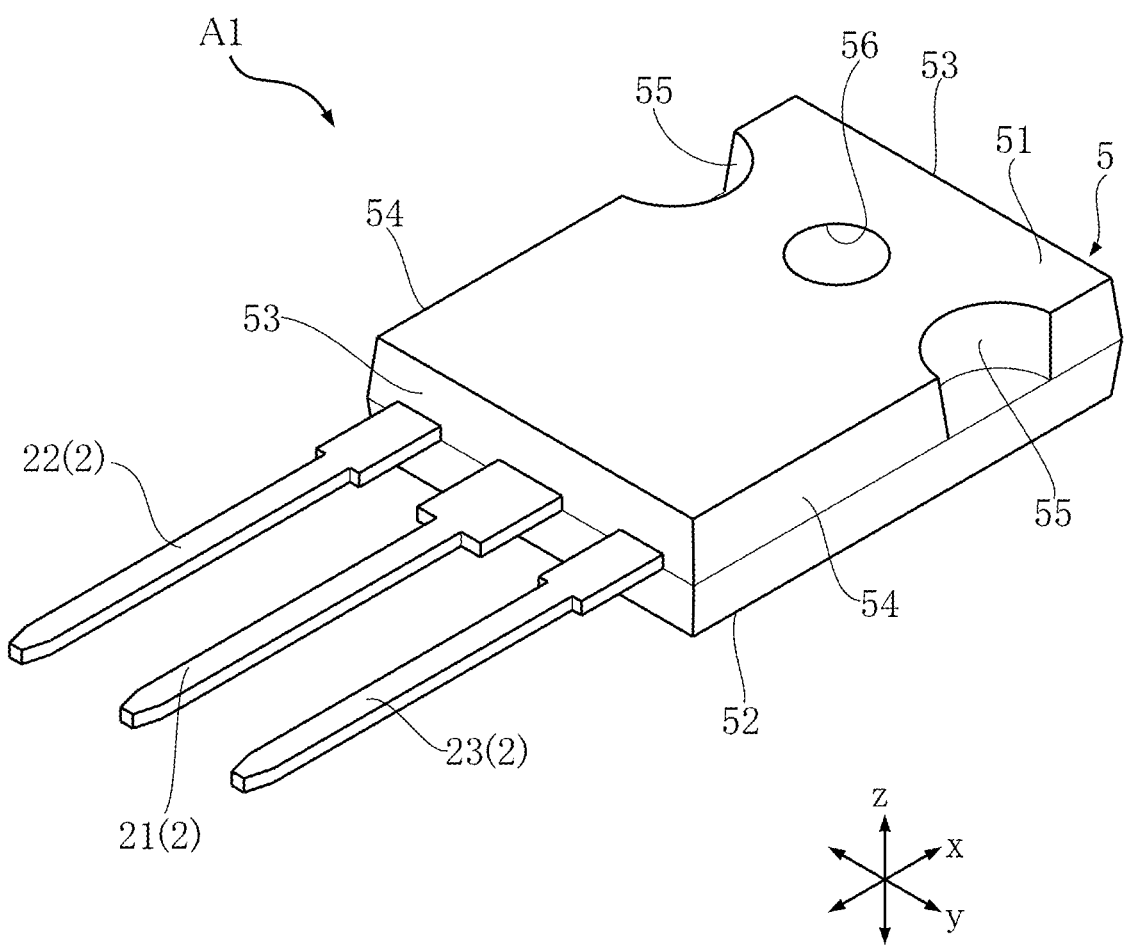
FIG. 1 is a perspective view of a semiconductor device according to an embodiment of the present disclosure.

Hereinafter, embodiments according to the present disclosure will be described specifically with reference to the drawings.

FIGS. 1 to 5 show a semiconductor device A1 according to an embodiment of the present disclosure. The semiconductor device A1 of the present disclosure is a semiconductor device that is surface mounted on an electric circuit board for use in, for example, an automobile, electronic equipment, and the like. The semiconductor device A1 includes a first semiconductor element 11, a second semiconductor element 12, a lead frame 2, a first solder 31, a second solder 32, a first wire 41, a second wire 42, a third wire 43, and a sealing resin 5.

Figure 2:
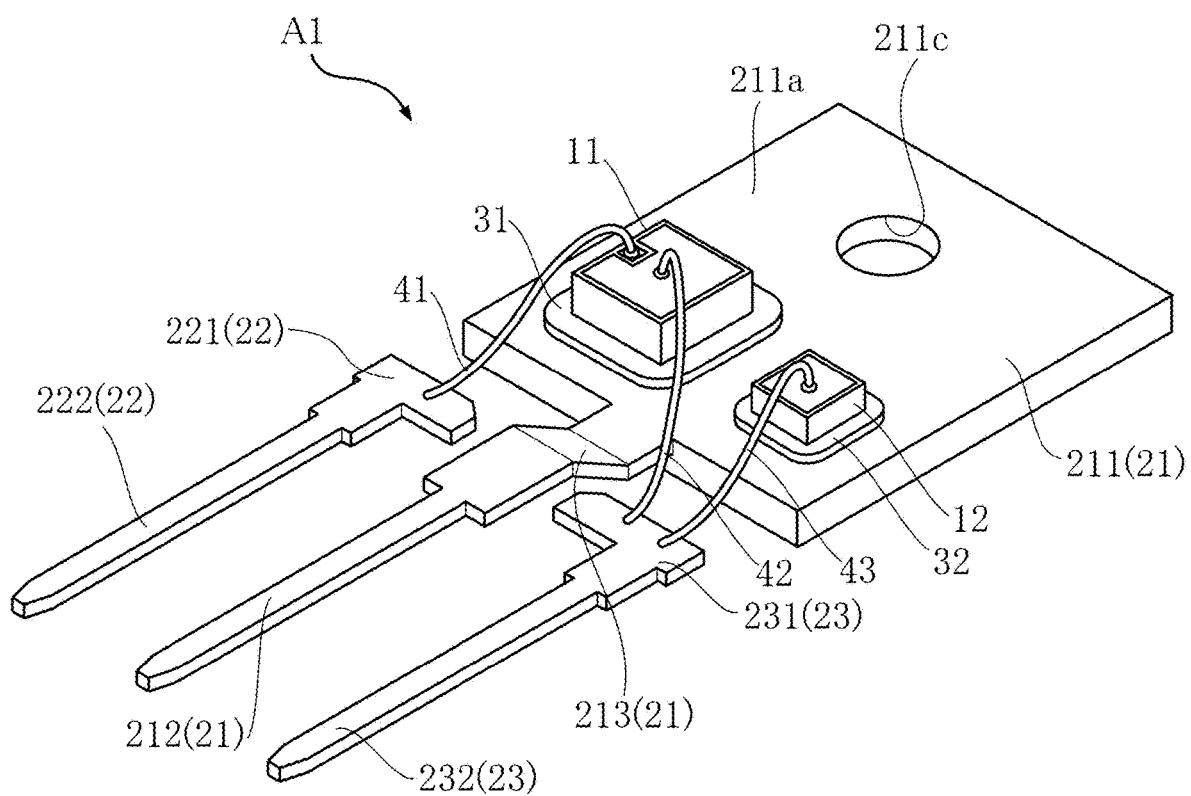
FIG. 2 is a perspective view of the semiconductor device shown in FIG. 1, without the illustration of a sealing resin.
Figure 3:
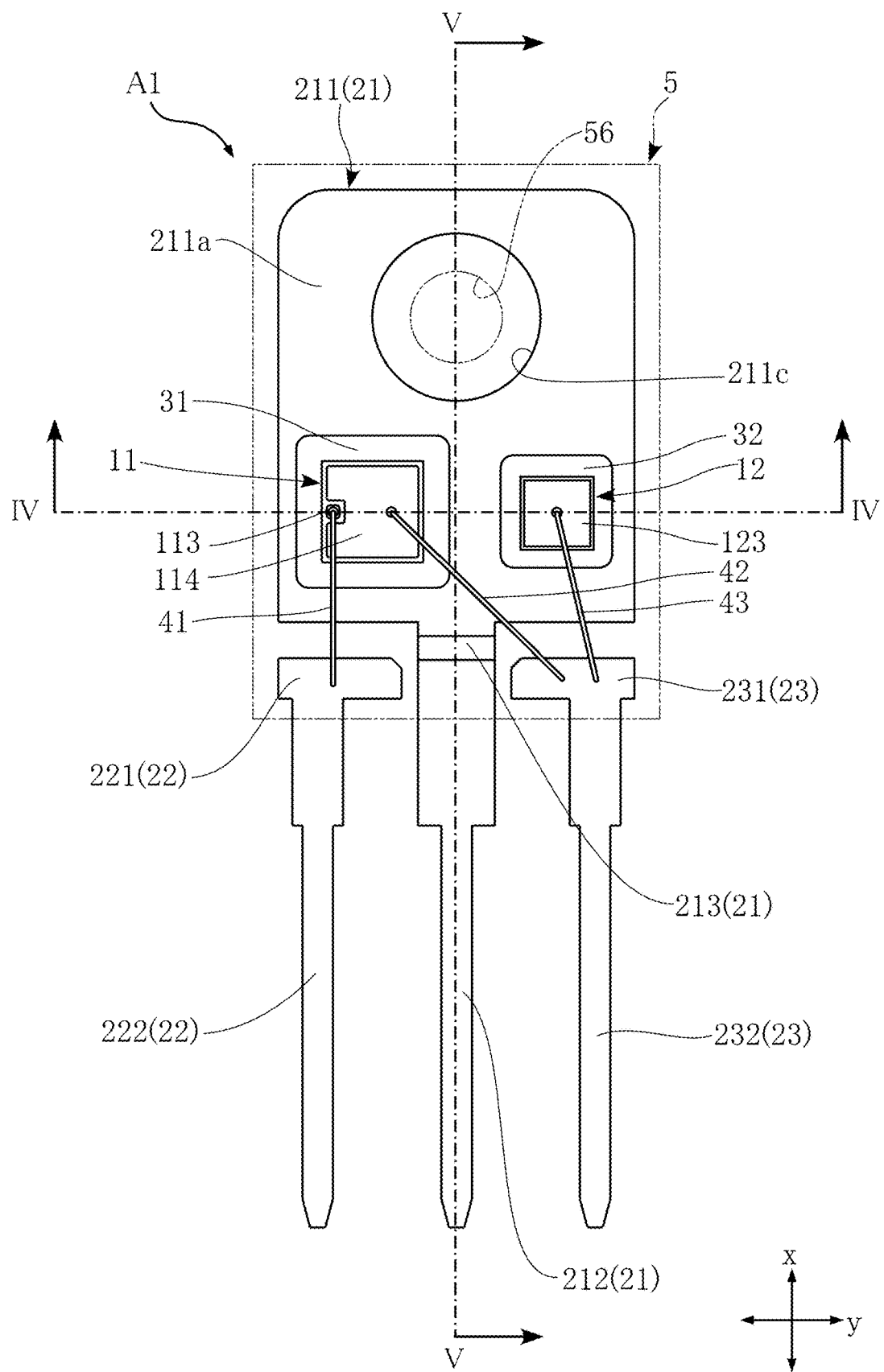
FIG. 3 is a plan view of the semiconductor device according to the embodiment of the present disclosure.
Figure 4:
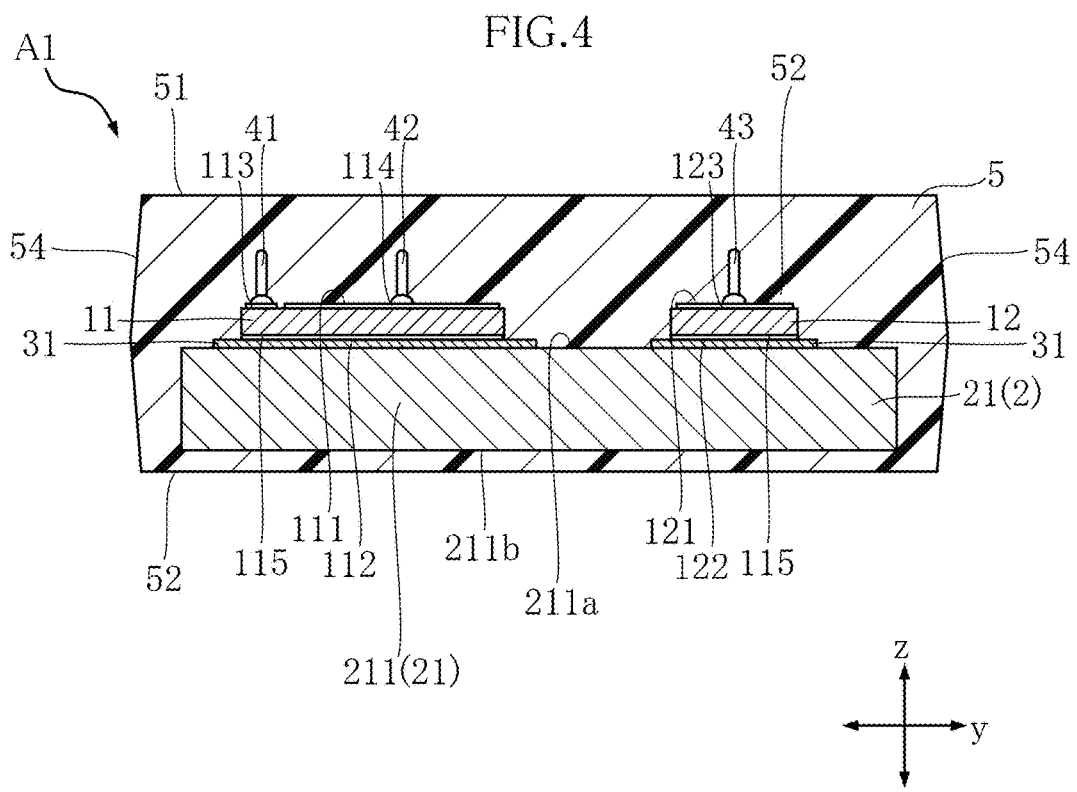
FIG. 4 is a cross-sectional view taken along the line IV-IV shown in FIG. 3.
Figure 5:
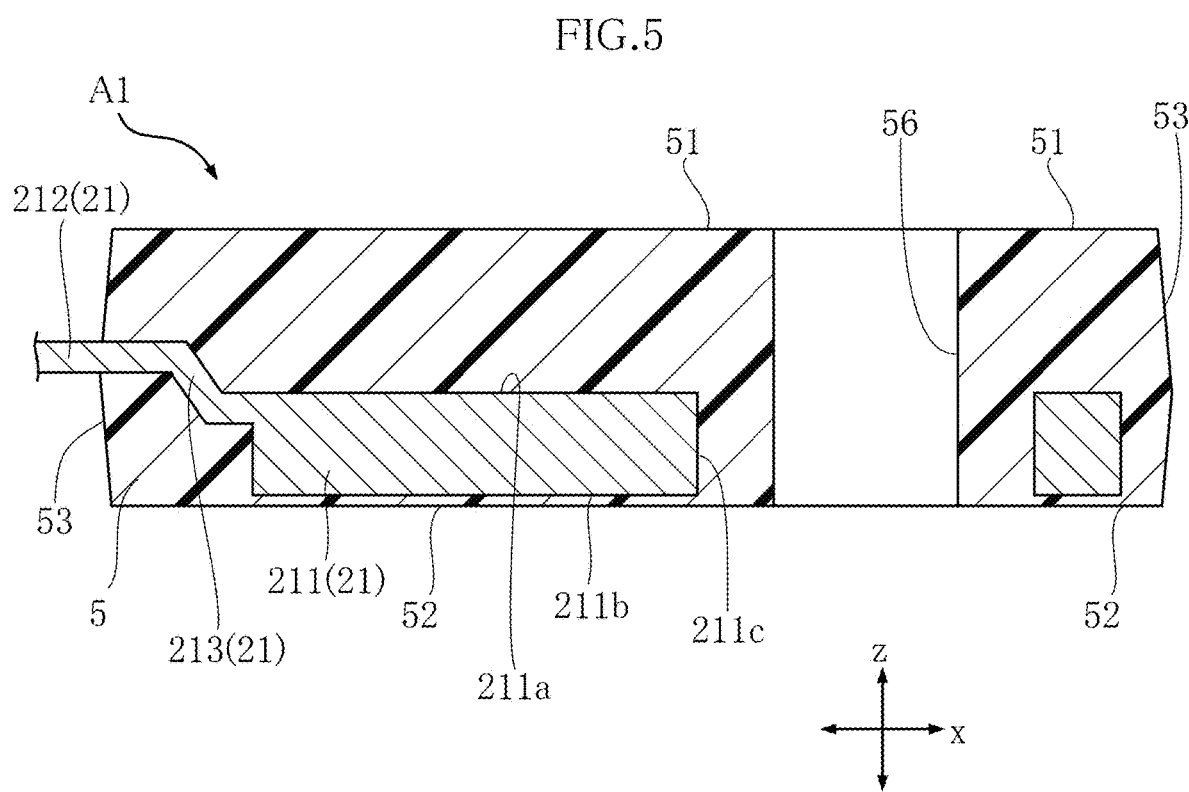
FIG. 5 is a cross-sectional view taken along the line V-V shown in FIG. 3.

FIG. 1 is a perspective view of the semiconductor device A1. FIG. 2 is a perspective view of the semiconductor device A1 shown in FIG. 1, without the illustration of the sealing resin 5. FIG. 3 is a plan view of the semiconductor device A1. FIG. 4 is a cross-sectional view taken along the line IV-IV shown in FIG. 3. FIG. 5 is a cross-sectional view taken along the line V-V shown in FIG. 3. In FIG. 3, the sealing resin 5 is shown in a see-through manner. For the sake of ease of understanding, the thickness direction of the semiconductor device A1 will be defined as a first direction z, the up down direction in the plan view (FIG. 3) that is perpendicular to the first direction z will be defined as a second direction x, and the right left direction in the plan view (FIG. 3) that is perpendicular to both the first direction z and the second direction x will be defined as a third direction y. The term "up" or "down" in the following description is used merely for the sake of description, and thus is not intended to limit the installation orientation of the semiconductor device A1 of the present disclosure.

The first semiconductor element 11 is a circuit element that is made of a semiconductor material and serves as an essential part for the functions of the semiconductor device A1. In the present embodiment, the first semiconductor element 11 is an IGBT (insulated gate bipolar transistor). As shown in FIG. 4, the first semiconductor element 11 includes a first semiconductor element main surface 111 and a first semiconductor element back surface 112.

The first semiconductor element main surface 111 is an upper surface of the first semiconductor element 11. The first semiconductor element back surface 112 is a lower surface of the first semiconductor element 11. The first semiconductor element main surface 111 and the first semiconductor element back surface 112 face opposite sides to each other in the first direction z.

Portions of the first semiconductor element main surface 111 are a first electrode pad 113 and a second electrode pad 114. The first electrode pad 113 is smaller in area than the second electrode pad 114. In the present embodiment, the first electrode pad 113 serves as a gate electrode of the IGBT, and the second electrode pad 114 serves as an emitter electrode of the IGBT. Also, a main portion of the first semiconductor element back surface 112 is a third electrode pad 115. In the present embodiment, the third electrode pad 115 serves as a collector electrode of the IGBT.

The second semiconductor element 12 is a circuit element made of a semiconductor material. In the present embodiment, the second semiconductor element 12 is a diode. As shown in FIG. 4, the second semiconductor element 12 includes a second semiconductor element main surface 121 and a second semiconductor element back surface 122.

The second semiconductor element main surface 121 is an upper surface of the second semiconductor element 12. The second semiconductor element back surface 122 is a lower surface of the second semiconductor element 12. The second semiconductor element main surface 121 and the second semiconductor element back surface 122 face opposite sides to each other in the first direction z.

The second semiconductor element main surface 121 serves as a main surface electrode pad 123. In the present embodiment, the main surface electrode pad 123 serves as an anode electrode of the diode. Also, the second semiconductor element back surface 122 serves as a back surface electrode pad 124. In the present embodiment, the back surface electrode pad 124 serves as a cathode electrode of the diode.

The first semiconductor element 11 and the second semiconductor element 12 are rectangular in shape as viewed in the thickness direction (as viewed in the first direction z). In the present embodiment, the first semiconductor element 11 and the second semiconductor element 12 each have a dimension of 1 mm to 10 mm square as viewed in the first direction z. Also, the first semiconductor element 11 has a dimension in the thickness direction of 40 μm to 300 μm, and the second semiconductor element 12 has a dimension in the thickness direction of 40 μm to 300 μm. In the present embodiment, the dimension in the thickness direction of the first semiconductor element 11 is set to be larger than that of the second semiconductor element 12.

The lead frame 2 is an electrically conductive member, and constitutes a conduction path between the semiconductor device A1 and a circuit board by being bonded to the circuit board. The lead frame 2 is made of an alloy composed mainly of Cu. A portion of the surface may be plated in consideration of corrosion resistance, electroconductivity, thermal conductivity, bondability, or the like. The lead frame 2 includes a first lead 21, a second lead 22, and a third lead 23.

The first lead 21 includes a first pad 211 (die pad), a first terminal 212, and an intermediate joint portion 213.

The first pad 211 includes a pad main surface 211a and a pad back surface 211b. The pad main surface 211a is an upper surface of the first pad 211. The pad main surface 211a is a surface on which the first semiconductor element 11 and the second semiconductor element 12 are mounted, and as shown in FIG. 4, the first semiconductor element back surface 112 and the second semiconductor element back surface 122 face the pad main surface 211a. The pad back surface 211b is a lower surface of the first pad 211. The pad main surface 211a and the pad back surface 211b are both flat and face opposite sides to each other in the first direction z. The first pad 211 may correspond to the "pad".

In the first pad 211, a pad through hole 211c extending from the pad main surface 211a to the pad back surface 211b is formed. The pad through hole 211c is spaced apart from the first semiconductor element 11 and the second semiconductor element 12 as viewed in the thickness direction. In the present embodiment, the pad through hole 211c has a circular shape as viewed in the thickness direction, but the shape is not limited thereto.

As shown in FIGS. 1 to 3, the first terminal 212 is a portion that extends along the second direction x and is partially exposed from the sealing resin 5. The first terminal 212 is in electrical conduction with the third electrode pad 115 via the intermediate joint portion 213, the first pad 211, and the first solder 31. As described above, the third electrode pad 115 serves as the collector electrode, and thus the first terminal 212 serves as a collector terminal of the semiconductor device A1.

As shown in FIGS. 2 and 3, the intermediate joint portion 213 is a portion that joins the first pad 211 and the first terminal 212. As shown in FIG. 5, in the first direction z, the first pad 211 and the first terminal 212 are provided in different positions, specifically, the first pad 211 is provided in a position lower than the first terminal 212 in FIG. 5. Accordingly, the intermediate joint portion 213 is inclined with respect to the first pad 211 and the first terminal 212. The intermediate joint portion 213 is entirely covered with the sealing resin 5.

As shown in FIGS. 1 to 3, the second lead 22 is a member that is disposed spaced apart from the first lead 21 and extends along the second direction x. In the third direction y, the second lead 22 is located on one side of the first terminal 212. The second lead 22 includes a second pad 221 and a second terminal 222.

As shown in FIG. 3, the second pad 221 is a portion that has a length in the third direction y that is longer than that of the second terminal 222 and is entirely covered with the sealing resin 5. As shown in FIGS. 2 and 3, the first wire 41 is connected to the second pad 221.

As shown in FIGS. 1 to 3, the second terminal 222 is a portion that extends along the second direction x and is partially exposed from the sealing resin 5. The second terminal 222 is in electrical conduction with the first electrode pad 113 via the second pad 221 and the first wire 41. In the present embodiment, as described above, the first electrode pad 113 serves as the gate electrode, and thus the second terminal 222 serves as a gate terminal of the semiconductor device A1.

As shown in FIGS. 1 to 3, the third lead 23 is a member that is disposed spaced apart from the first lead 21 and the second lead 22 and extends along the second direction x. In the third direction y, the third lead 23 is located on an opposite side of the second lead 22 across the first terminal 212. The third lead 23 includes a third pad 231 and a third terminal 232.

As shown in FIG. 3, the third pad 231 is a portion that has a length in the third direction y that is longer than that of the third pad 231 and is entirely covered with the sealing resin 5. As shown in FIGS. 2 and 3, the second wire 42 and the third wire 43 are connected to the third pad 231. As shown in FIGS. 1 to 3, the third terminal 232 is a portion that extends along the second direction x and is partially exposed from the sealing resin 5. The third terminal 232 is in electrical conduction with the second electrode pad 114 via the third pad 231 and the second wire 42. In the present embodiment, as described above, the second electrode pad 114 serves as the emitter electrode, the third terminal 232 serves as a emitter terminal of the semiconductor device A1. Also, the third terminal 232 is in electrical conduction with the main surface electrode pad 123 via the third pad 231 and the third wire 43.

The exposed portions of the first terminal 212, the second terminal 222, and the third terminal 232 that are exposed from the sealing resin 5 may be coated with a plating. As a result of coating the exposed portions with a plating, it is possible to improve corrosion resistance.

As shown in FIGS. 2 and 4, the first solder 31 is a member that is provided between the first semiconductor element 11 and the first pad 211 of the first lead 21 and has electroconductivity. With the first solder 31, the first semiconductor element 11 is mounted on the first pad 211, and the electrical conduction between the third electrode pad 115 of the first semiconductor element 11 and the first lead 21 is thereby ensured.

As shown in FIGS. 2 and 4, the second solder 32 is a member that is provided between the second semiconductor element 12 and the first pad 211 of the first lead 21 and has electroconductivity. With the second solder 32, the second semiconductor element 12 is mounted on the first pad 211, and the electrical conduction between the back surface electrode pad 124 of the second semiconductor element 12 and the first lead 21 is thereby ensured.

As described above, the third electrode pad 115 of the first semiconductor element 11 and the back surface electrode pad 124 of the second semiconductor element 12 are both in electrical conduction with the first lead 21, and thus the third electrode pad 115 of the first semiconductor element 11 and the back surface electrode pad 124 of the second semiconductor element 12 are electrically connected. Accordingly, the collector electrode of the first semiconductor element 11 and the cathode electrode of the second semiconductor element 12 are electrically connected.

The first solder 31 and the second solder 32 each have a dimension (thickness) in the first direction z of 70 µm or more. The dimension is preferably 150 µm or less because heat dissipation tends to decrease as the thickness of the first solder 31 and the second solder 32 increases. That is, the first solder 31 and the second solder 32 have a thickness of 70 µm to 150 µm. In the present embodiment, the first solder 31 and the second solder 32 each have a thickness of 100 µm. The first solder 31 and the second solder 32 may have different thicknesses. Also, the thickness (70 µm to 150 µm) of the first solder 31 and the second solder 32 may be set as appropriate according to the size of the first semiconductor element 11 and the second semiconductor element 12.

The first solder 31 has a melting point (hereinafter referred to as "first melting point") higher than a melting point (hereinafter referred to as "second melting point") of the second solder 32. The first solder 31 and the second solder 32 contain tin (Sn), and in the present embodiment, the first solder 31 has less tin content than that of the second solder 32 so as to cause the first melting point to be higher than the second melting point. Preferably, the first melting point is 300 degrees to 340 degrees (expressed in Celsius in the present disclosure), and the second melting point is 280 degrees to 320 degrees (except for a combination of the first melting point and the second melting point in which the first melting point is lower than the second melting point). In the present embodiment, the first melting point is set to 320 degrees, and the second melting point is set to 290 degrees. The tin content of the first solder 31 and the tin content of the second solder 32 are determined according to the first melting point and the second melting point. The first melting point may be caused to be higher than the second melting point by using a factor other than tin content. As used herein, "content" refers to the amount expressed in mass or volume.

The first wire 41, the second wire 42, and the third wire 43 are members that are made of the same metal and have electroconductivity. In the present embodiment, the first wire 41, the second wire 42, and the third wire 43 are made of Al (aluminum) or an Al alloy.

As shown in FIGS. 2 and 3, the first wire 41 has one end that is bonded to the second pad 221 and another end that is bonded to the first electrode pad 113 of the first semiconductor element main surface 111. Accordingly, the first wire 41 provides electrical conduction between the second pad 221 and the first electrode pad 113.

As shown in FIGS. 2 and 3, the second wire 42 has one end that is bonded to the third pad 231 and another end that is bonded to the second electrode pad 114 of the first semiconductor element main surface 111. Accordingly, the second wire 42 provides electrical conduction between the third pad 231 and the second electrode pad 114.

As shown in FIGS. 2 and 3, the third wire 43 has one end that is bonded to the third pad 231 and another end that is bonded to the main surface electrode pad 123 of the second semiconductor element main surface 121. The third wire 43 provides electrical conduction between the third pad 231 and the main surface electrode pad 123.

The third pad 231 is in electrical conduction with the second electrode pad 114, or in other words, the emitter electrode of the first semiconductor element 11 via the second wire 42, and is in electrical conduction with the main surface electrode pad 123, or in other words, the anode electrode of the second semiconductor element 12 via the third wire 43. Accordingly, the emitter electrode of the first semiconductor element 11 and the anode electrode of the second semiconductor element 12 are electrically connected. Because the emitter electrode of the first semiconductor element 11 and the anode electrode of the second semiconductor element 12 are electrically connected, and also as described above, the collector electrode of the first semiconductor element 11 and the cathode electrode of the second semiconductor element 12 are electrically connected, the first semiconductor element 11 and the second semiconductor element 12 are connected in anti-parallel.

The sealing resin 5 is a member that covers a portion of the lead frame 2, as well as the first semiconductor element 11, the second semiconductor element 12, the first wire 41, the second wire 42, and the third wire 43. The sealing resin 5 is an electrically insulative thermosetting synthetic resin. In the present embodiment, the sealing resin 5 is a black epoxy resin. The sealing resin 5 includes a resin main surface 51, a resin back surface 52, a pair of resin first side surfaces 53, and a pair of resin second side surfaces 54.

The resin main surface 51 is an upper surface of the sealing resin 5 as shown in FIGS. 4 and 5. The resin back surface 52 is a lower surface of the sealing resin 5 as shown in FIGS. 4 and 5. The resin main surface 51 and the resin back surface 52 face opposite sides to each other in the first direction z.

As shown in FIG. 5, the pair of resin first side surfaces 53 are surfaces that are formed so as to be spaced apart from each other in the second direction x. The pair of resin first side surfaces 53 face opposite sides to each other in the second direction x. Upper ends of the resin first side surfaces 53 shown in FIG. 5 join the resin main surface 51, and lower ends of the resin first side surfaces 53 shown in FIG. 5 join the resin back surface 52. In the present embodiment, the first lead 21 (the first terminal 212), the second lead 22 (the second terminal 222), and the third lead 23 (the third terminal 232) are partially exposed from one of the resin first side surfaces 53.

The sealing resin 5 has a pair of recessed portions 55 formed therein, the pair of recessed portions 55 being recessed from top portions of the pair of resin second side surfaces 54 shown in FIG. 1 into the inside of the sealing resin 5. Also, as shown in FIGS. 1 and 5, in the first direction z, the sealing resin 5 has a resin through hole 56 formed therein, the resin through hole 56 extending from the resin main surface 51 to the resin back surface 52. In the present embodiment, the resin through hole 56 has a center that is coaxial with that of the pad through hole 211c. Also, the resin through hole 56 has a diameter smaller than that of the pad through hole 211c. In the present embodiment, the hole wall of the pad through hole 211c is entirely covered with the sealing resin 5.

Figure 6:
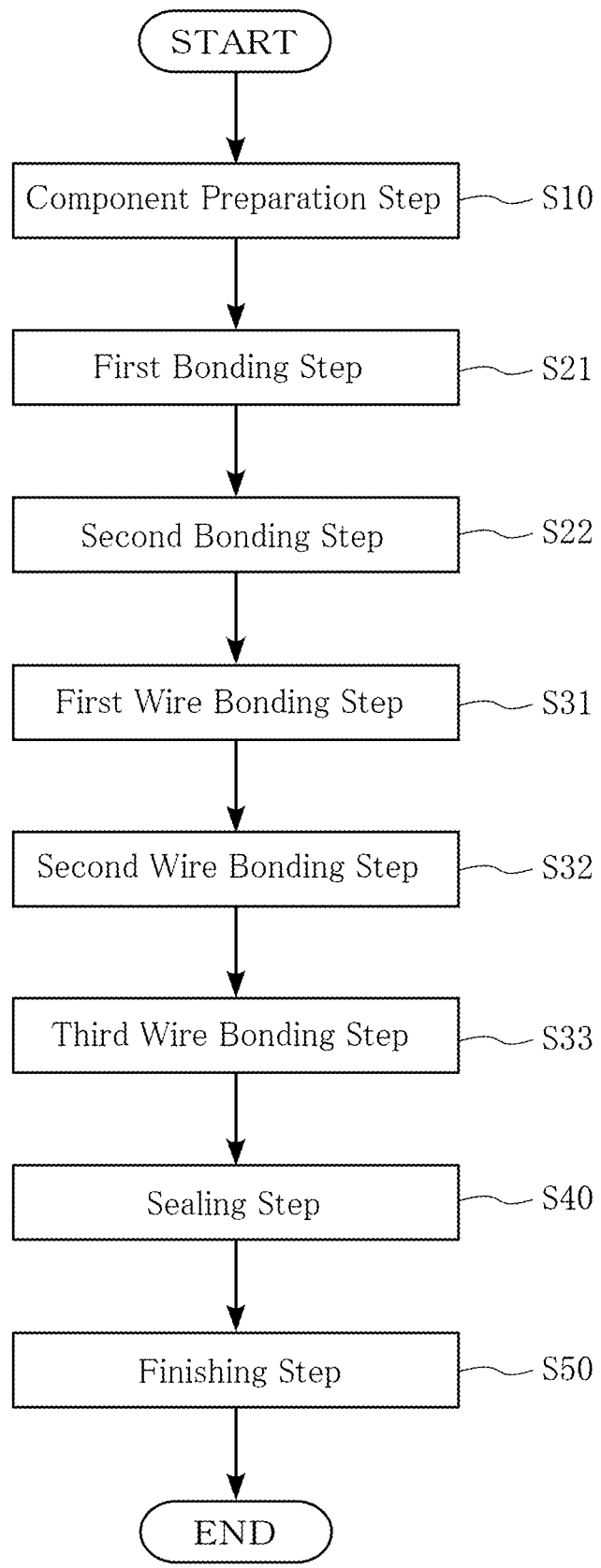
FIG. 6 is a flowchart illustrating a method of manufacturing a semiconductor device.

Next is a description of a method of manufacturing a semiconductor device A1 configured as described above. FIG. 6 is a flowchart illustrating a method of manufacturing a semiconductor device A1.

The method of manufacturing a semiconductor device A1 according to the present embodiment includes a component preparation step S10, a first die bonding step S21, a second die bonding step S22, a first wire bonding step S31, a second wire bonding step S32, a third wire bonding step S33, a sealing step S40, and a finishing step S50.

Figure 7:
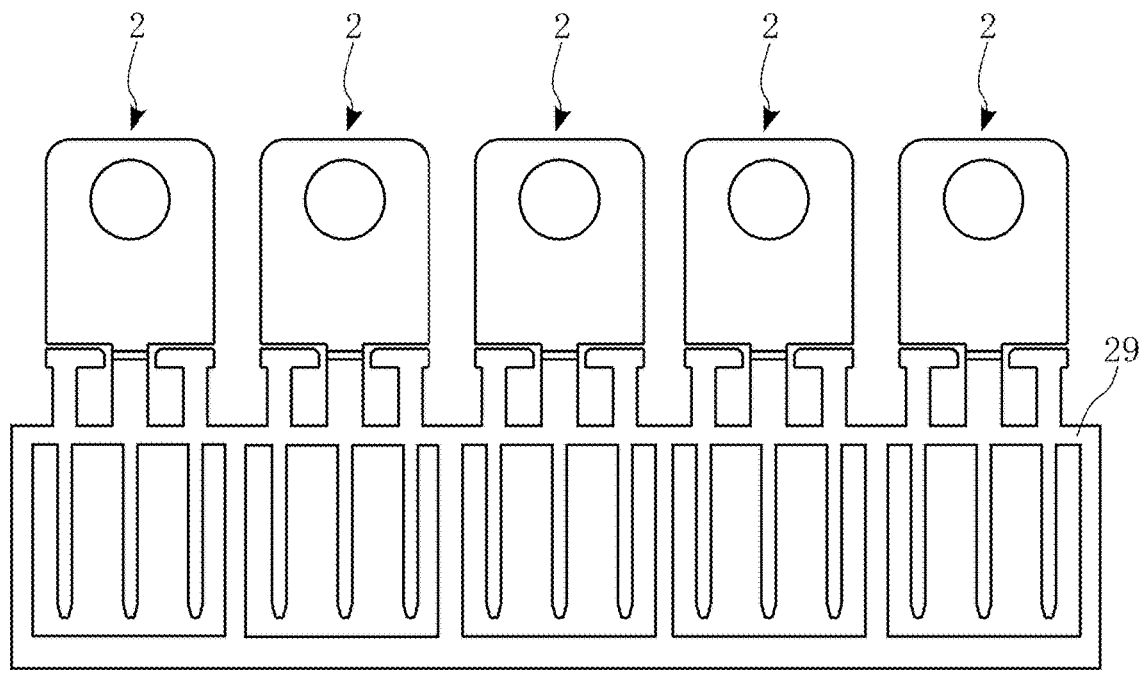
FIG. 7 is a diagram showing a semiconductor device (lead frame) during a process of manufacturing the semiconductor device (component preparation step).

The component preparation step S10 is a step of preparing constituent elements of a semiconductor device A1 described above. To be specific, a first semiconductor element 11 and a second semiconductor element 12 that have a predetermined size are respectively obtained through dicing from a wafer for the first semiconductor element 11 and a wafer for the second semiconductor element 12. Also, a lead frame having a shape as shown in FIG. 7 is molded by die molding. The lead frame in the component preparation step S10 is molded unitarily by a plurality of lead frames 2 being joined by a joint portion 29.

The first die bonding step S21 and the second die bonding step S22 are a step of die bonding the first semiconductor element 11 and a step of die bonding the second semiconductor element 12, respectively. The first die bonding step S21 and the second die bonding step S22 are performed by using, for example, a known die bonder, and are also called a mounting step.

The first die bonding step S21 is a step of conductively bonding the first semiconductor element 11 to a first pad 211 via a first solder 31. To be specific, a first solder 31 in the form of a paste is applied onto a pad main surface 211a of a first pad 211, and the first semiconductor element 11 is placed thereon via the first solder 31. Then, the furnace ambient temperature is increased to a temperature higher than or equal to the first melting point (320 degrees in the present embodiment) so as to melt the first solder 31. After that, the furnace ambient temperature is decreased to room temperature (a temperature lower than or equal to the first melting point) so as to harden the first solder 31. The first semiconductor element 11 and the first pad 211 are thereby conductively bonded. The first die bonding step S21 is performed such that the first solder 31 has a predetermined thickness (100 μm in the present embodiment) after the first solder 31 has been hardened.

The second die bonding step S22 is a step of conductively bonding the second semiconductor element 12 to the first pad 211 via a second solder 32. To be specific, the second die bonding step S22 is performed in the same manner as in the first die bonding step S21. That is, a second solder 32 in the form of a paste is applied onto the pad main surface 211a of the first pad 211, and the second semiconductor element 12 is placed thereon via the second solder 32. Then, the furnace ambient temperature is increased to a temperature higher than or equal to the second melting point (290 degrees in the present embodiment) and less than the first melting point so as to melt the second solder 32. At this time, by setting the furnace ambient temperature to not exceed the first melting point, it is possible to suppress re-melting of the first solder 31. After that, the furnace ambient temperature is decreased to room temperature (a temperature lower than or equal to the second melting point) so as to harden the second solder 32. The second semiconductor element 12 and the first pad 211 are thereby conductively bonded. The second die bonding step S22 is performed such that the second solder 32 has a predetermined thickness (100 μm in the present embodiment) after the second solder 32 has been hardened.

The first wire bonding step S31, the second wire bonding step S32, and the third wire bonding step S33 are a step of bonding a first wire 41, a step of bonding a second wire 42, and a step of bonding a third wire 43, respectively. The first wire bonding step S31, the second wire bonding step S32, and the third wire bonding step S33 are performed by using, for example, a known wire bonder.

The first wire bonding step S31 is a step of wire bonding one end of the first wire 41 to a first electrode pad 113 and wire bonding the other end of the first wire 41 to a second pad 221 by using a known wire bonder. To be specific, first, a tip end portion of a wire is caused to protrude from the capillary of the wire bonder and is then melted so as to form the tip end portion of the wire into a ball shape. Then, the tip end portion is pressed against the first electrode pad 113. Next, the capillary is moved while the wire is drawn out from the capillary, and the wire is pressed against the second pad 221. Then, the capillary is moved up, with the wire being held by the clamper of the capillary, and the wire is thereby cut. As a result, a first wire 41 is formed, and the first electrode pad 113 and the second pad 221 are conductively connected. Here, the wire bonding performed by forming the tip end portion of the wire into a ball shape and pressing the tip end portion against a predetermined position will be referred to as "first bonding", and the wire bonding performed by pressing the wire against a predetermined position and cutting the wire will be referred to as "second bonding". In the first wire bonding step S31, first bonding is performed on the first electrode pad 113, and second bonding is performed on the second pad 221. It is also possible to perform first bonding on the second pad 221 and second bonding on the first electrode pad 113.

The second wire bonding step S32 is a step of wire bonding one end of the second wire 42 to a second electrode pad 114 and wire bonding the other end of the second wire 42 to a third pad 231 by using a known wire bonder. To be specific, the second wire bonding step S32 is performed in the same manner as in the first wire bonding step S31. That is, first bonding is performed on the second electrode pad 114, and second bonding is performed on the third pad 231. It is also possible to perform first bonding on the third pad 231 and second bonding on the second electrode pad 114. As a result, a second wire 42 is formed, and the second electrode pad 114 and the third pad 231 are conductively connected.

The third wire bonding step S33 is a step of wire bonding one end of the third wire 43 to a main surface electrode pad 123 and wire bonding the other end of the third wire 43 to the third pad 231 by using a known wire bonder. To be specific, the third wire bonding step S33 is performed in the same manner as in the first wire bonding step S31, first bonding is performed on the main surface electrode pad 123, and second bonding is performed on the third pad 231. It is also possible to perform first bonding on the third pad 231 and second bonding on the main surface electrode pad 123. As a result, a third wire 43 is formed, and the main surface electrode pad 123 and the third pad 231 are conductively connected.

The order in which the first wire bonding step S31, the second wire bonding step S32, and the third wire bonding step S33 are performed is not limited to the above-described order, and the order can be changed in any way.

Figure 8:
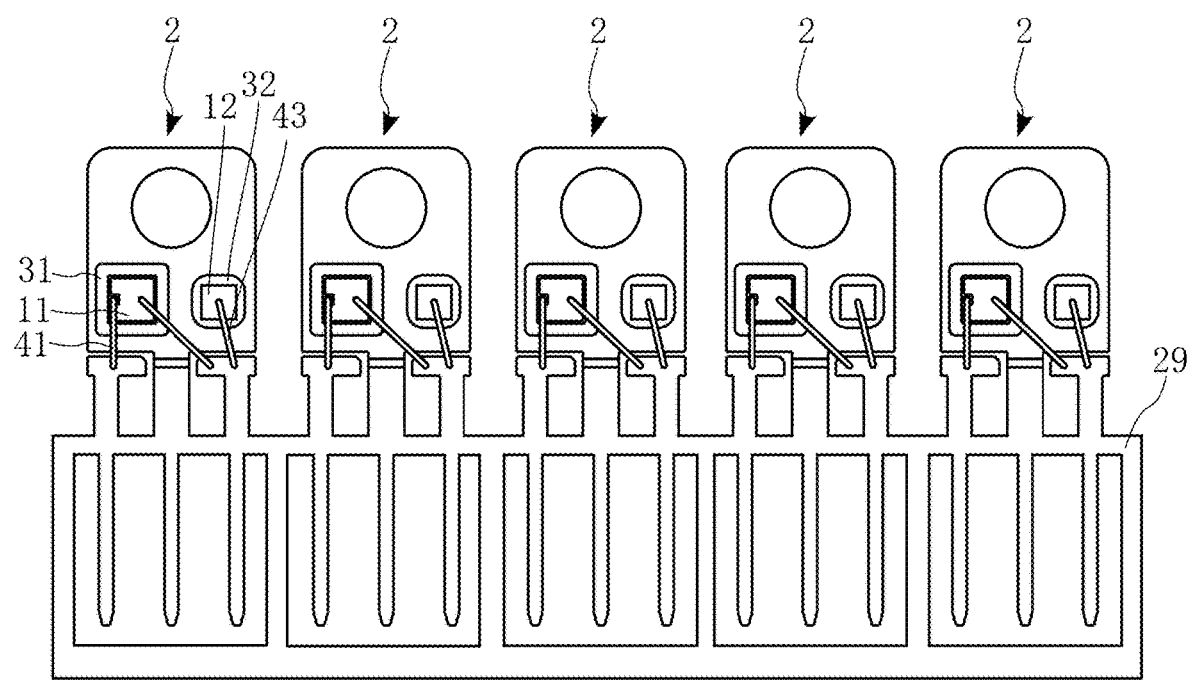
FIG. 8 is a diagram showing a semiconductor device during a process of manufacturing the semiconductor device (at the end of a third wire bonding step).

FIG. 8 shows a state of semiconductor devices A1 after the first die bonding step S21, the second die bonding step S22, the first wire bonding step S31, the second wire bonding step S32, and the third wire bonding step S33 have been performed.

Figure 9:
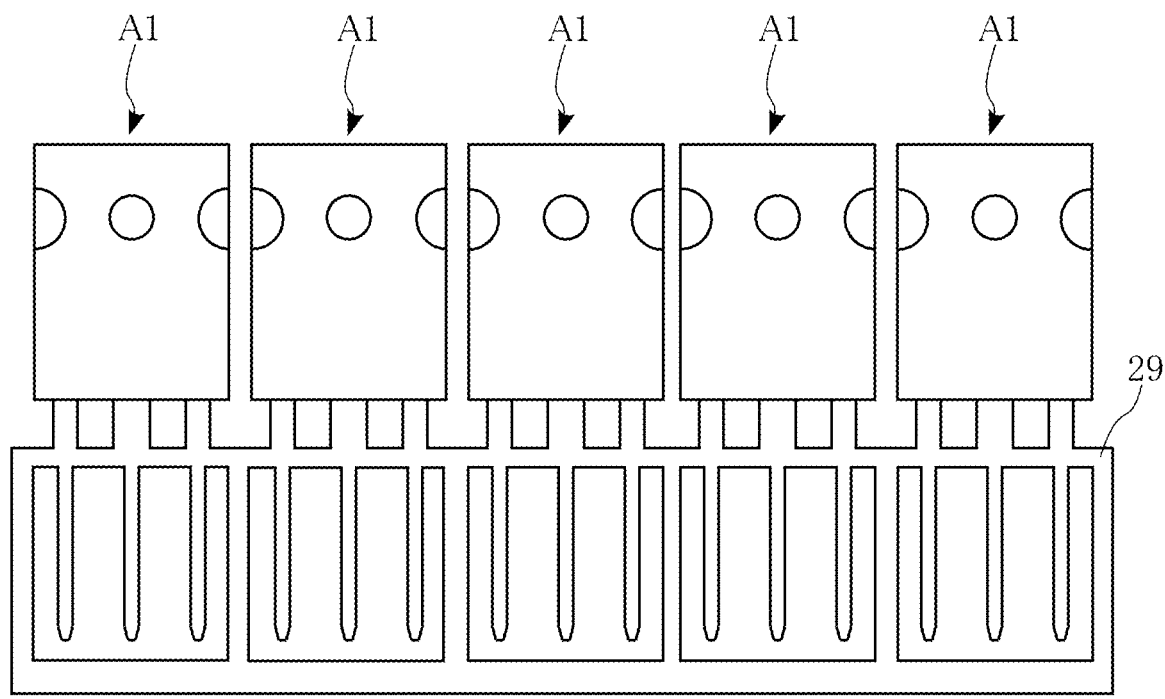
FIG. 9 is a diagram showing a semiconductor device during a process of manufacturing the semiconductor device (at the end of a sealing step).

The sealing step S40 is a step of forming a sealing resin 5 so as to package each semiconductor device A1. That is, the sealing step S40 is a step of forming a sealing resin 5 having the above-described shape. The sealing step S40 is performed by, for example, a known transfer molding that uses a die. To be specific, lead frames 2 (see FIG. 8) in each of which the first semiconductor element 11, the second semiconductor element 12, the first wire 41, the second wire 42, and the third wire 43 are bonded are set in a die molding machine, and a fluid epoxy resin is poured into a die so as to mold lead frames 2. Then, the epoxy resin is cured, and the molded lead frames 2 are taken out from the die. Then, the resin is shaped into the shape of sealing resin 5 as described above by removing unnecessary resin and burrs. FIG. 9 shows a state of semiconductor devices A1 after the sealing step S40 has been performed.

The finishing step S50 is a step of shaping each semiconductor device A1 so as to have a shape as shown in FIG. 1 and finishing the semiconductor device A1 as a shippable product. The finishing step S50 includes, for example, a removing step of removing an unnecessary portion (the joint portion 29, etc.) of the lead frames 2 that is exposed from the sealing resin 5, an outer packaging step for improving the strength against bending of each lead frame 2 exposed from the sealing resin 5, improving solder wettability when mounting onto a printed substrate and preventing rust, a lead processing step of bending the lead frame 2 exposed from the sealing resin 5 into a predetermined shape, a stamping step of impressing company name, product name, lot number and the like on the package, and an inspection/selection step of determining whether or not the product is defective. These steps may be carried out as appropriate according to the specifications of the finished semiconductor device A1. Through the finishing step S50, a semiconductor device A1 as shown in FIG. 1 is obtained.

The method according to the present embodiment includes: the first die bonding step S21 of die bonding the first semiconductor element 11 to the pad main surface 211a of the first pad 211 by using the first solder 31; and the second die bonding step S22 of die bonding the second semiconductor element 12 to the pad main surface 211a of the first pad 211 by using the second solder 32 having a melting point lower than that of the first solder 31 after the first die bonding step S21. With this configuration, it is possible to prevent melting of the first solder 31 when the second semiconductor element 12 is die bonded. Accordingly, the deterioration of bonding strength of the first semiconductor element 11 and the occurrence of positional offset of the first semiconductor element 11 can be suppressed, and thus the first semiconductor element 11 and the second semiconductor element 12 can be properly soldered.

According to the present embodiment, the first solder 31 and the second solder 32 are configured to have a thickness of 70 μm to 150 μm and stacked. In a conventional semiconductor device, the solder thickness is about 50 μm. However, according to the present disclosure, the first solder 31 and the second solder 32 are configured to have a thickness greater than the conventional solder thickness. FIGS. 10A, 10B, 11A, and 11B are diagrams illustrating advantageous effects obtained by such a configuration, specifically, the results of a temperature cycle test to verify resistance against temperature cycle. With respect to FIGS. 10A and 10B, verification was performed a plurality of times.

Figure 10A:
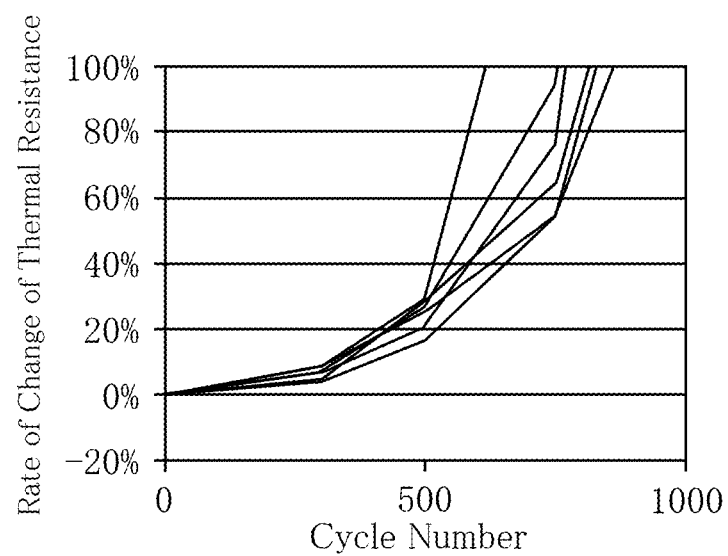
FIGS. 10A and 10B are graphs each showing a relationship between the number of cycles and the rate of change of thermal resistance in a temperature cycle test.
Figure 10B:
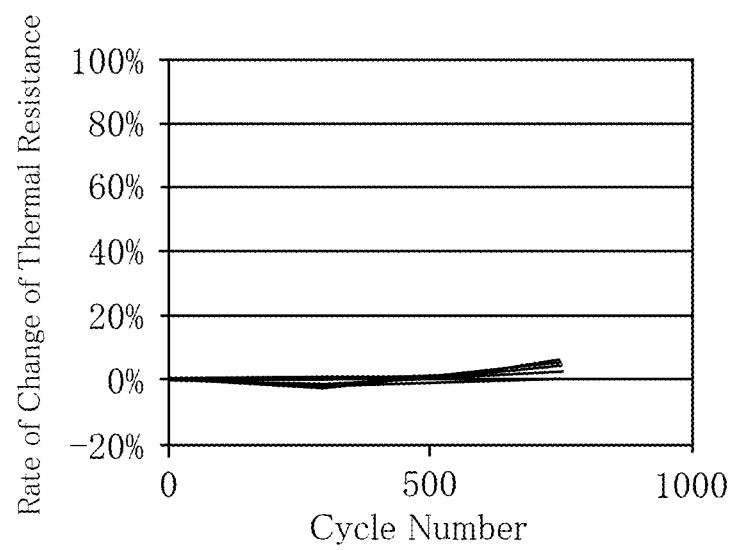
Figure 11A:
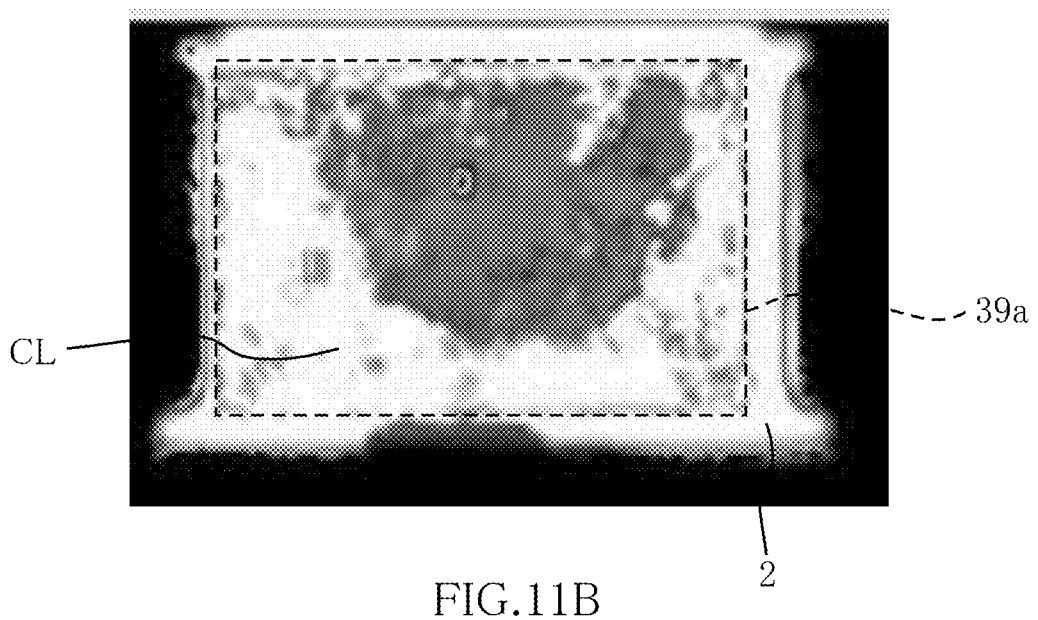
FIGS. 11A and 11B are diagrams each showing the state of solder after a temperature cycle test.
Figure 11B:
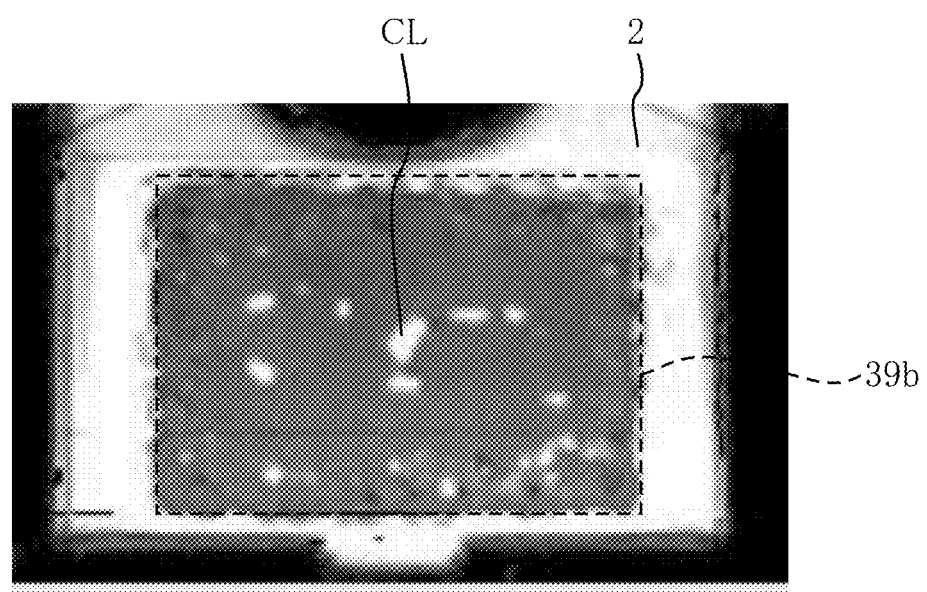

FIGS. 10A and 10B are graphs each showing a relationship between the number of cycles and the rate of change of thermal resistance in a temperature cycle test, and FIGS. 11A and 11B are images showing the state of solder 39a after the temperature cycle test and the state of solder 39b after the temperature cycle test, respectively. In the temperature cycle test, semiconductor devices having only one semiconductor element (for example, the first semiconductor element 11) mounted thereon were used. FIGS. 10A and 11A show a result in the case of a solder 39a having a thickness of 50 μm, FIGS. 10B and 11B show a result in the case of a solder 39b having a thickness of 100 μm. That is, FIGS. 10A and 11A show a result of verification of a conventional semiconductor device, and FIGS. 10B and 11B show a result of verification of the semiconductor device A1 of the present disclosure.

In the case of the solder 39a having a thickness of 50 μm, as shown in FIG. 10A, the rate of change of thermal resistance of the semiconductor device starts increasing from after about 300 cycles and increases steeply from after about 500 cycles. On the other hand, in the case of the solder 39b having a thickness of 100 μm, as shown in FIG. 10B, the rate of change of thermal resistance of the semiconductor device was almost unchanged even after 800 cycles. Also, in the case of the solder 39a having a thickness of 50 μm, as shown in FIG. 11A, it can be seen that many solder cracks CL (solder damage) are formed in the solder 39a after the temperature cycle test. In the diagram, white portions indicate the areas where solder cracks CL are formed. On the other hand, in the case of the solder 39b having a thickness of 100 μm, as shown in FIG. 11B, it can be seen that few solder cracks CL are formed in the solder 39b after the temperature cycle test.

The results of verification shown in FIGS. 10A, 10B, 11A, and 11B show that with the semiconductor device A1 in which the first solder 31 and the second solder 32 have a thickness greater than the conventional solder thickness, it is possible to suppress a change in the rate of change of thermal resistance as well as suppressing the occurrence of solder cracks. Accordingly, the semiconductor device A1 has improved resistance against temperature cycle as compared to the conventional semiconductor device. Furthermore, the semiconductor elements (the first semiconductor element 11 and the second semiconductor element 12) are properly soldered to the lead frame 2.

According to the present embodiment, the first semiconductor element 11 is bonded by using the first solder 31, and the second semiconductor element 12 is bonded by using the second solder 32. The tin content in the first solder 31 is less than that in the second solder 32. A solder with a small tin content is unlikely to be broken, and a solder with a large tin content is more likely to be broken. Accordingly, by bonding the first semiconductor element 11 having a larger dimension than that of the second semiconductor element 12 as viewed in the thickness direction with the use of the first solder 31, soldering can be performed more properly.

According to the present embodiment, the resin through hole 56 extending from the resin main surface 51 to the resin back surface 52 is formed in the sealing resin 5. As a result of this configuration, it is possible to provide a member having a heat dissipating function such as a heat spreader by inserting a fastening member such as a screw into the resin through hole 56. Accordingly, it is possible to improve heat dissipation performance.

The embodiment given above has been described by taking an example in which an IGBT is used as the first semiconductor element 11, but the configuration is not limited thereto. A transistor other than an IGBT may be used. An example of such a transistor is a MOSFET (metal oxide semiconductor field effect transistor). In the case where a MOSFET is used as the first semiconductor element 11, the first electrode pad 113 corresponds to the drain electrode, the second electrode pad 114 corresponds to the gate electrode, and the third electrode pad 115 corresponds to the source electrode. Accordingly, the first terminal 212 of the first lead 21 corresponds to the drain terminal, the second terminal 222 of the second lead 22 corresponds to the gate terminal, and the third terminal 232 of the third lead 23 corresponds to the source terminal.

The embodiment given above has been described by taking an example in which one end of the second wire 42 is bonded to the second electrode pad 114, and the other end of the second wire 42 is bonded to the third pad 231, but the other end of the second wire 42 may be bonded to the main surface electrode pad 123, rather than the third pad 231. Also, the embodiment given above has been described by taking an example in which one end of the third wire 43 is bonded to the main surface electrode pad 123, and the other end of the third wire 43 is bonded to the third pad 231, but the other end of the third wire 43 may be bonded to the second electrode pad 114, rather than the third pad 231. Even when wire bonding is performed as described above, the electrical connection is the same as that of the embodiment given above. That is, the semiconductor device A1 has the same circuit configuration, and thus can provide the same advantageous effects.

The embodiment given above has been described by taking an example in which the first pad 211 of the first lead 21 is entirely packaged with the sealing resin 5, but the configuration is not limited thereto. A configuration is also possible in which a portion of the first pad 211 (to be specific, a portion that is on an opposite side of the side on which the first terminal 212 extends) is exposed from the sealing resin 5.

The embodiment given above has been described by taking an example in which two semiconductor elements, namely, the first semiconductor element 11 and the second semiconductor element 12, are provided, but three or more semiconductor elements may be provided. In this case, solder materials having different melting points may be prepared according to the number of semiconductor elements, and a plurality of semiconductor elements may be die bonded to the first pad 211 sequentially by using the solder materials in descending order of melting point.

The above disclosure encompasses embodiments according to the following Clauses.

[Clause A1]

A method of manufacturing a semiconductor device, the method including:

preparing a lead frame, the lead frame including a first lead including a pad and a first terminal, the pad including a pad main surface and a pad back surface that face opposite sides to each other in a first direction, and the first terminal extending from the pad along a second direction that is perpendicular to the first direction;

preparing a first semiconductor element and a second semiconductor element, each of the first semiconductor element and the second semiconductor element having an element main surface and an element back surface that face opposite sides to each other;

die bonding the element back surface of the first semiconductor element to the pad main surface by using a first solder; and die bonding the element back surface of the second semiconductor element to the pad main surface by using a second solder having a melting point lower than a melting point of the first solder, after die bonding the element back surface of the first semiconductor element to the pad main surface by using the first solder.

[Clause A2]
The method of manufacturing a semiconductor device according to Clause A1,
wherein the first solder and the second solder contain tin, and
the first solder has a less tin content than a tin content of the second solder.

[Clause A3]
The method of manufacturing a semiconductor device according to Clause A1 or A2,
wherein the first solder has a melting point of 300 degrees Celsius to 340 degrees Celsius, and the second solder has a melting point of 280 degrees Celsius to 320 degrees Celsius.

[Clause A4]
The method of manufacturing a semiconductor device according to any one of Clauses A1 to A3,
wherein the second semiconductor element is smaller in dimension as viewed in the first direction than the first semiconductor element.

[Clause A5]
The method of manufacturing a semiconductor device according to any one of Clauses A1 to A4,
wherein in die bonding the element back surface of the first semiconductor element to the pad main surface by using the first solder, the first solder is stacked to have a dimension in the first direction of 70 μm to 150 μm.

[Clause A6]
The method of manufacturing a semiconductor device according to Clause A5,
wherein the first semiconductor element has a size of 1 mm to 10 mm square as viewed in the first direction.

[Clause A7]
The method of manufacturing a semiconductor device according to Clause A6,
wherein the first semiconductor element has a dimension in the first direction of 40 μm to 300 μm.

[Clause A8]
The method of manufacturing a semiconductor device according to any one of Clauses A5 to A7,
wherein in die bonding the element back surface of the second semiconductor element to the pad main surface by using the second solder, the second solder is stacked to have a dimension in the first direction of 70 μm to 150 μm.

[Clause A9]
The method of manufacturing a semiconductor device according to Clause A8,
wherein the second semiconductor element has a dimension in the first direction of 40 μm to 300 μm.

[Clause A10]
The method of manufacturing a semiconductor device according to any one of Clauses A1 to A9, wherein the lead frame includes a second lead and a third lead that are spaced apart from the first lead and extend along the second direction.

[Clause A11]
The method of manufacturing a semiconductor device according to Clause A10,
wherein the first lead, the second lead, and the third lead are provided side by side in a third direction that is perpendicular to both the first direction and the second direction, and the first lead is located between the second lead and the third lead in the third direction.

[Clause A12]
The method of manufacturing a semiconductor device according to Clause A11,
wherein a die bonding position of the first semiconductor element in die bonding the element back surface of the first semiconductor element to the pad main surface by using the first solder and a die bonding position of the second semiconductor element in the step of die bonding the element back surface of the second semiconductor element to the pad main surface by using the second solder are side by side in the third direction.

[Clause A13]
The method of manufacturing a semiconductor device according to Clause A11 or A12,
wherein the first semiconductor element includes a first electrode pad and a second electrode pad that are on the element main surface of the first semiconductor element, and a third electrode pad on the element back surface of the first semiconductor element.

[Clause A14]
The method of manufacturing a semiconductor device according to Clause A13,
wherein the second semiconductor element includes a main surface electrode pad on the element main surface of the second semiconductor element, and a back surface electrode pad on the element back surface of the second semiconductor element.

[Clause A15]
The method of manufacturing a semiconductor device according to Clause A14,
wherein in die bonding the element back surface of the first semiconductor element to the pad main surface by using the first solder, the third electrode pad and the pad main surface are conductively bonded by using the first solder.

[Clause A16]
The method of manufacturing a semiconductor device according to Clause A15,
wherein in die bonding the element back surface of the second semiconductor element to the pad main surface by using the second solder, the back surface electrode pad and the pad main surface are conductively bonded by using the second solder.

[Clause A17]
The method of manufacturing a semiconductor device according to Clause A16, further including:
connecting the first electrode pad and the second lead by using a first wire;
connecting the second electrode pad and the third lead by using a second wire; and
connecting the main surface electrode pad and the third lead by using a third wire.

[Clause A18]
The method of manufacturing a semiconductor device according to Clause A17,
wherein in connecting the second electrode pad and the third lead by using the second wire, the second electrode pad is connected to the main surface electrode pad, instead of the third lead.

[Clause A19]
The method of manufacturing a semiconductor device according to Clause A17,
wherein in connecting the main surface electrode pad and the third lead by using the third wire, the main surface electrode pad is connected to the second electrode pad, instead of the third lead.

[Clause A20]
The method of manufacturing a semiconductor device according to any one of Clauses A17 to A19, further including covering with a sealing resin a portion of the first lead, a portion of the second lead, a portion of the third lead, a portion or entirety of the pad, the first semiconductor element, the second semiconductor element, the first wire, the second wire, and the third wire.

[Clause A21]

The method of manufacturing a semiconductor device according to Clause A20, wherein in covering with the sealing resin, an electrically insulative resin is used as the sealing resin.

[Clause A22]

The method of manufacturing a semiconductor device according to any one of Clauses A1 to A21, wherein a transistor is used as the first semiconductor element.

[Clause A23]

The method of manufacturing a semiconductor device according to Clause A22, wherein the transistor is an insulated gate bipolar transistor.

[Clause A24]

The method of manufacturing a semiconductor device according to Clause A22 or A23, wherein a diode is used as the second semiconductor element.

[Clause A25]

The method of manufacturing a semiconductor device according to Clause A24, wherein the diode is connected in anti-parallel to the transistor.

[Clause A26]

A semiconductor device including:

a lead frame including a first lead including a pad and a first terminal, the pad including a pad main surface and a pad back surface that face opposite sides to each other in a first direction, and the first terminal extending from the pad along a second direction that is perpendicular to the first direction;

a first semiconductor element and a second semiconductor element, each of the first semiconductor element and the second semiconductor element having an element main surface and an element back surface that face opposite sides to each other in the first direction, and the element back surface of the first semiconductor element and the element back surface of the second semiconductor element facing the pad main surface, a first solder that is provided between the first semiconductor element and the pad main surface and provides conductive bonding between the first semiconductor element and the pad; and a second solder that is provided between the second semiconductor element and the pad main surface, provides conductive bonding between the second semiconductor element and the pad, and has a melting point lower than a melting point of the first solder.

[Clause A27]

The semiconductor device according to Clause A26, wherein the first solder and the second solder contain tin, and the first solder has a less tin content than a tin content of the second solder.

[Clause A28]

The semiconductor device according to Clause A26 or A27, wherein the first solder has a melting point of 300 degrees Celsius to 340 degrees Celsius, and the second solder has a melting point of 280 degrees Celsius to 320 degrees Celsius.

[Clause A29]

The method of manufacturing a semiconductor device according to any one of Clauses A26 to A28, wherein the second semiconductor element is smaller in dimension as viewed in the first direction than the first semiconductor element.

[Clause A30]

The method of manufacturing a semiconductor device according to any one of Clauses A26 to A29, wherein the first solder has a dimension in the first direction of 70 μm to 150 μm.

[Clause A31]

The semiconductor device according to Clause A30, wherein the first semiconductor element has a size of 1 mm to 10 mm square as viewed in the first direction.

[Clause A32]

The semiconductor device according to Clause A31, wherein the first semiconductor element has a dimension in the first direction of 40 μm to 300 μm.

[Clause A33]

The method of manufacturing a semiconductor device according to any one of Clauses A30 to A32, wherein the second solder has a dimension in the first direction of 70 μm to 150 μm.

[Clause A34]

The semiconductor device according to Clause A33, wherein the second semiconductor element has a dimension in the first direction of 40 μm to 300 μm.

FIGS. 12 to 16 show a semiconductor device A1 according to another embodiment of the present disclosure. The semiconductor device A1 of the present disclosure is a semiconductor device that is surface mounted on an electric circuit board for use in, for example, an automobile, electronic equipment, and the like. The semiconductor device A1 includes a plurality of semiconductor elements 1 (a first semiconductor element 11 and a second semiconductor element 12), a lead frame 2, a plurality of solders 3 (a first solder 31 and a second solder 32), a plurality of wires 4 (a first wire 41, a second wire 42, and a third wire 43), and a sealing resin 5.

Figure 12:
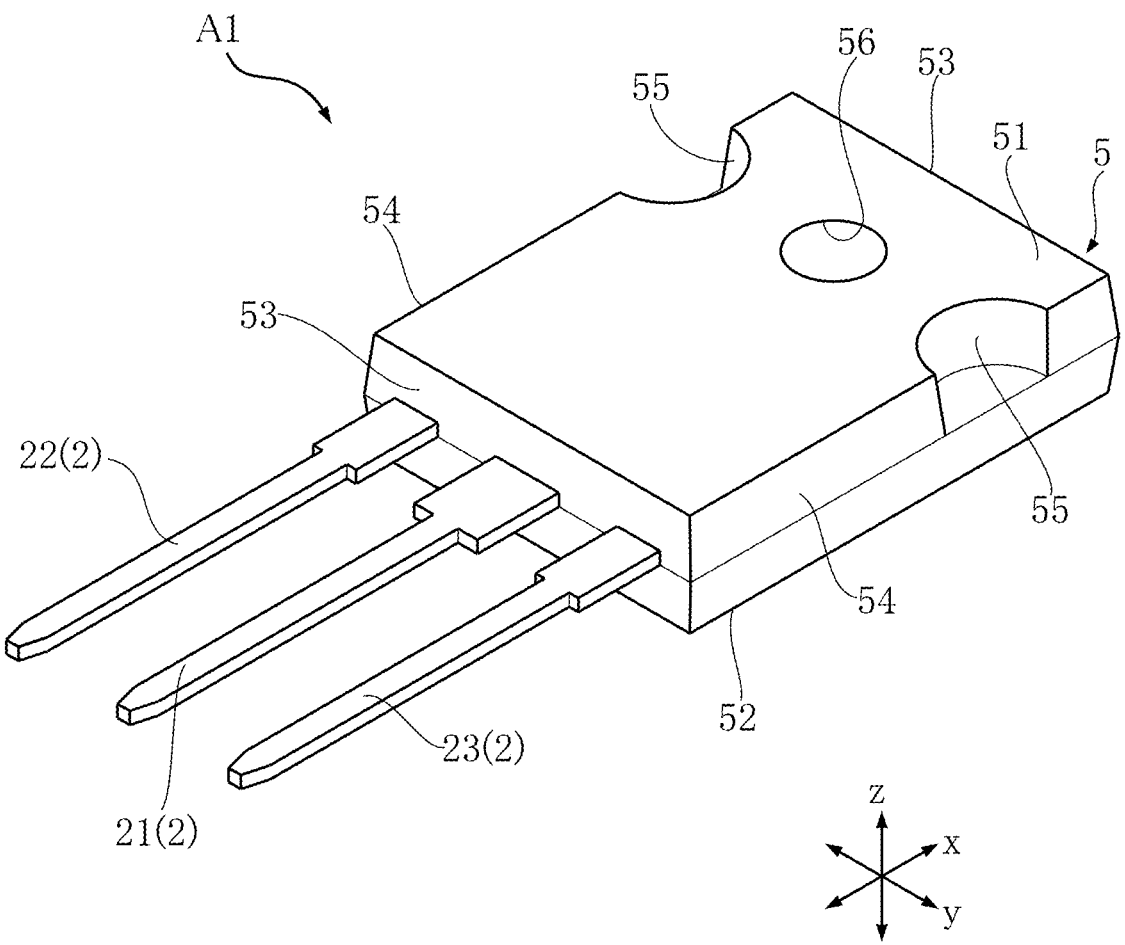
FIG. 12 is a perspective view of a semiconductor device according to another embodiment of the present disclosure.
Figure 13:
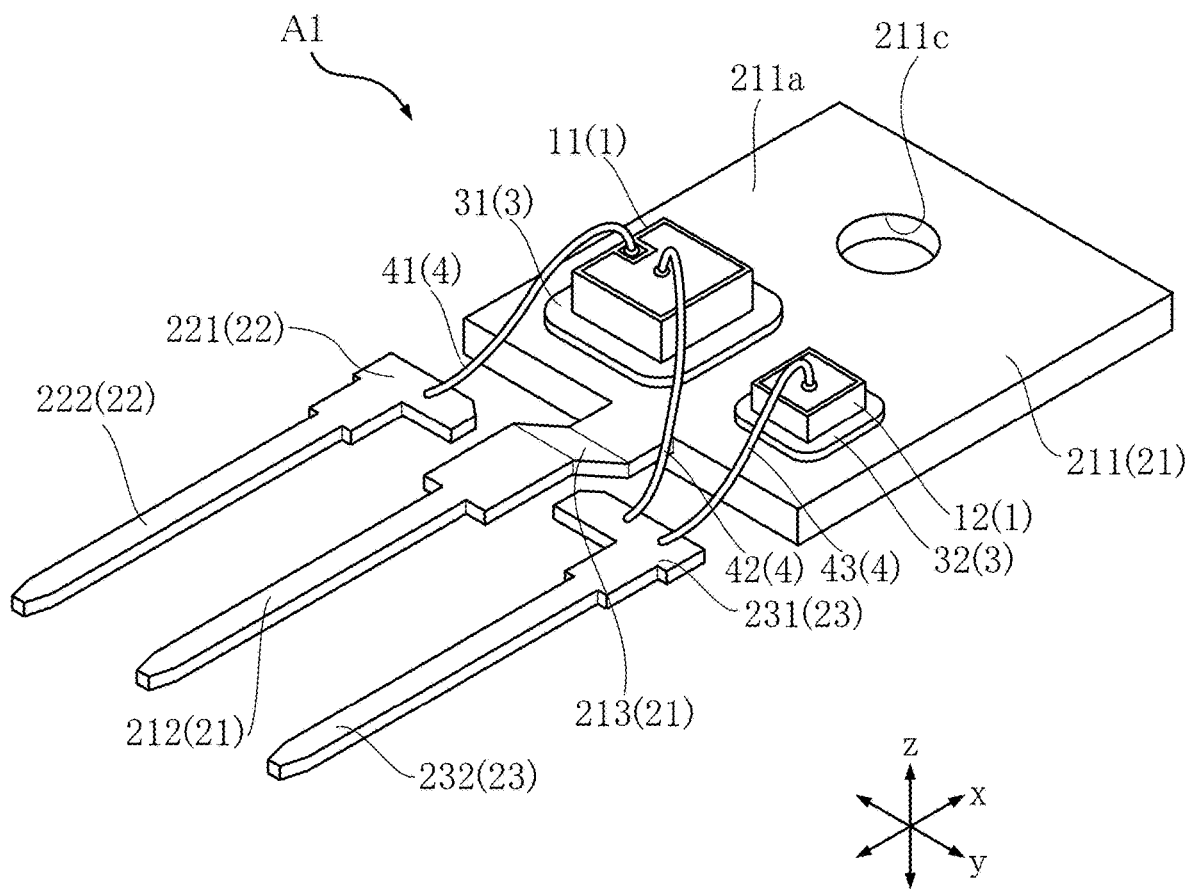
FIG. 13 is a perspective view of the semiconductor device shown in FIG. 12, without the illustration of a sealing resin.
Figure 14:
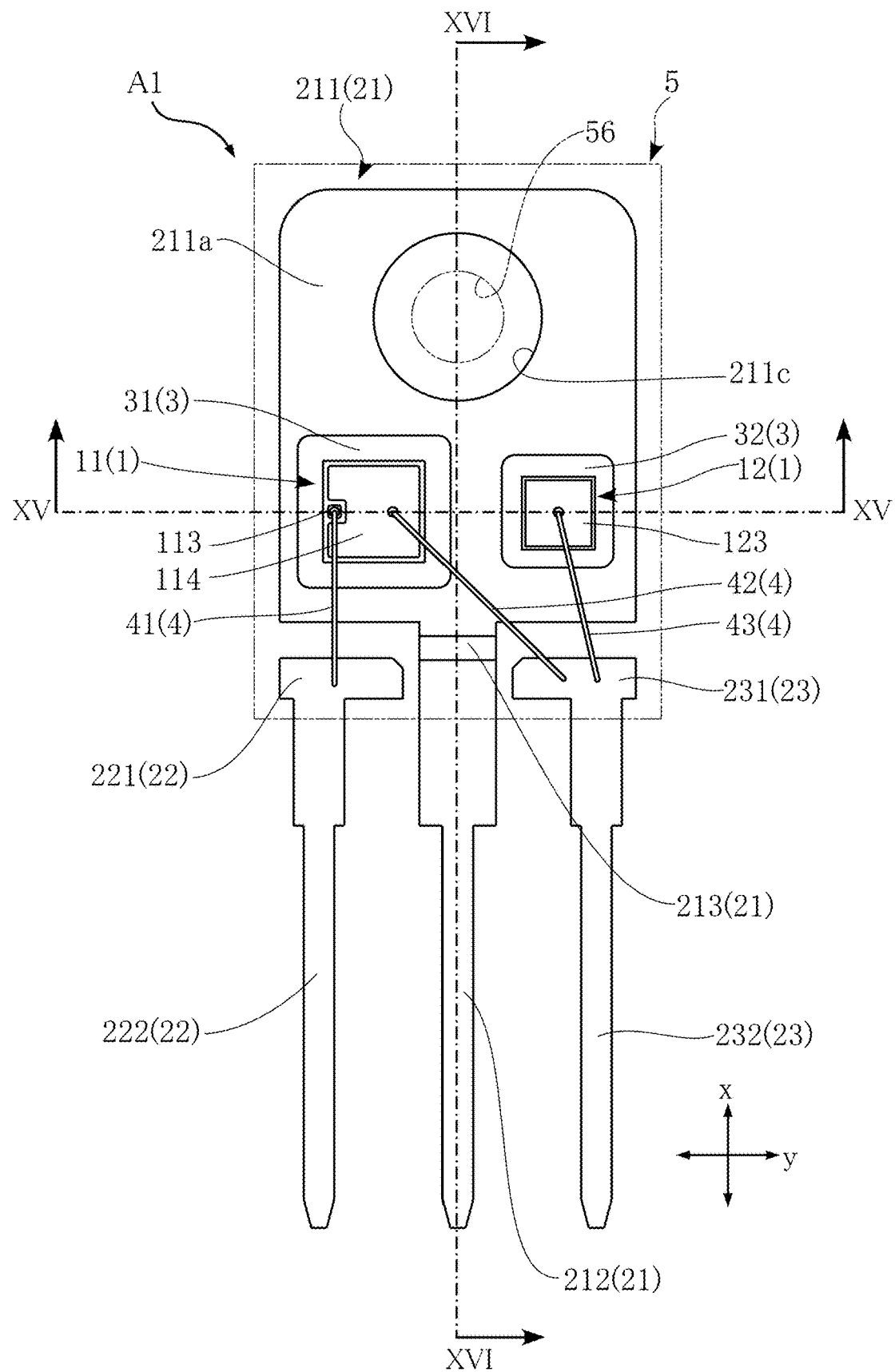
FIG. 14 is a plan view of the semiconductor device according to the embodiment of the present disclosure.
Figure 15:
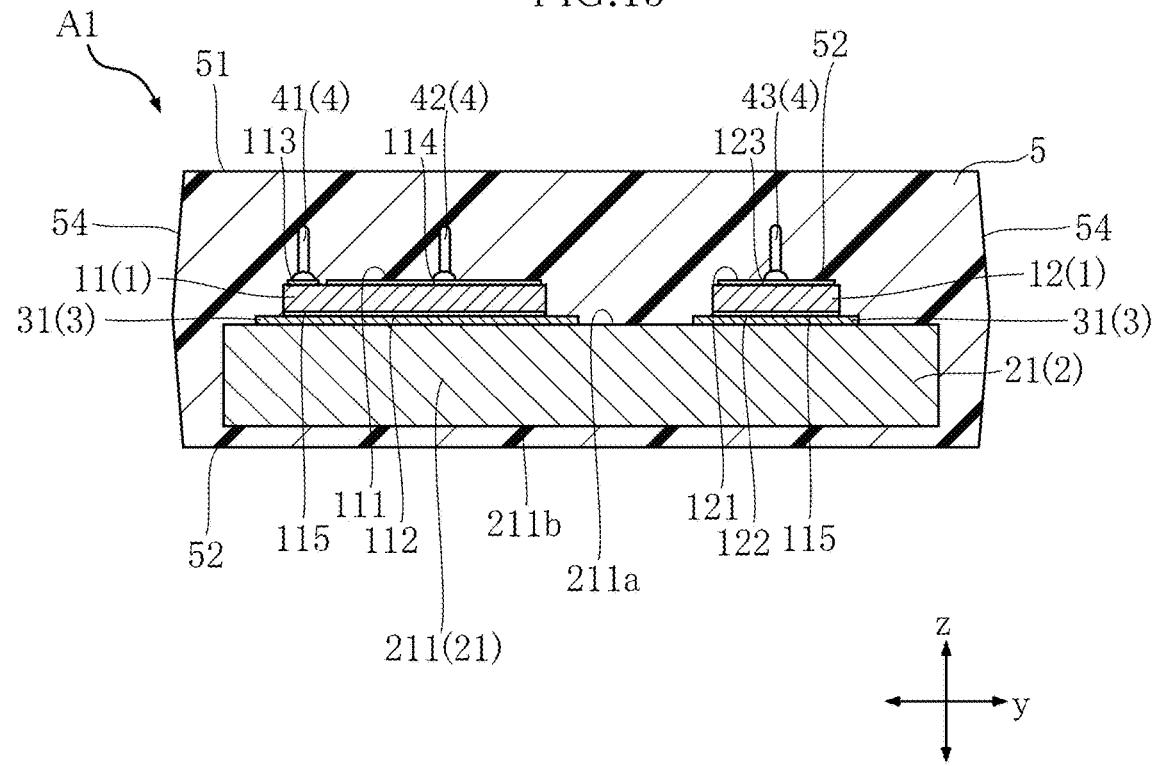
FIG. 15 is a cross-sectional view taken along the line XV-XV shown in FIG. 14.
Figure 16:
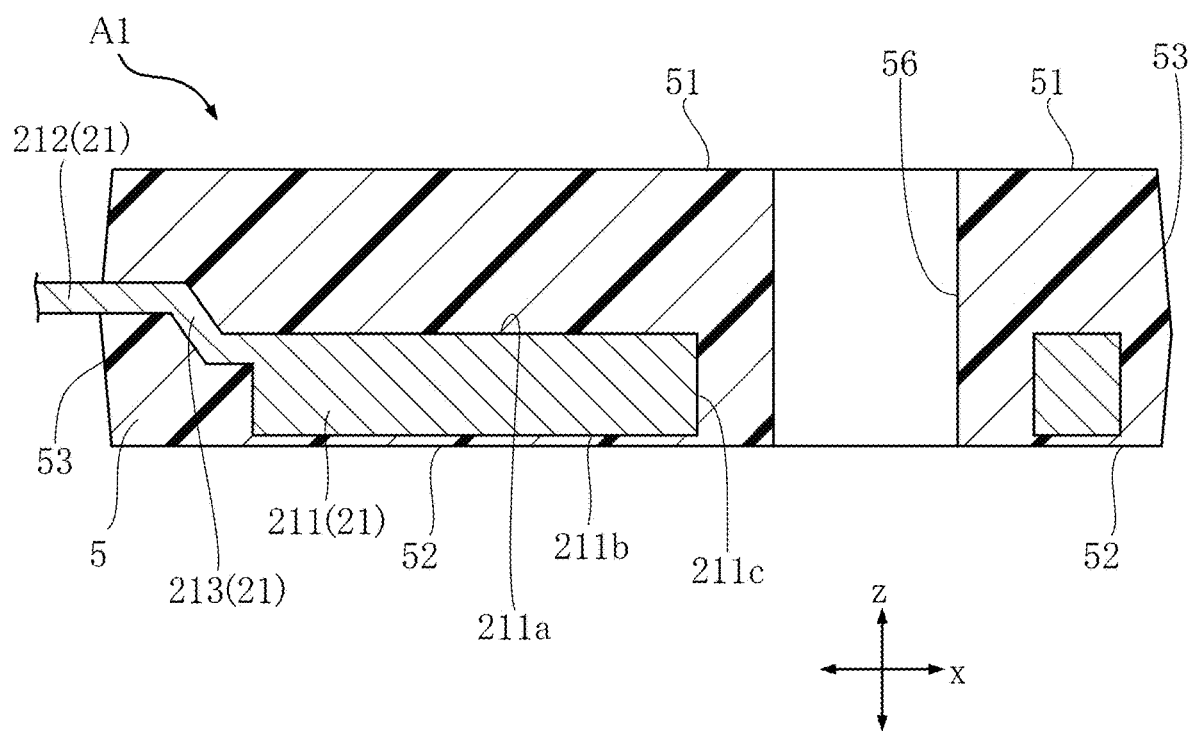
FIG. 16 is a cross-sectional view taken along the line XVI-XVI shown in FIG. 14.

FIG. 12 is a perspective view of the semiconductor device A1. FIG. 13 is a perspective view of the semiconductor device A1 shown in FIG. 12, without the illustration of the sealing resin 5. FIG. 14 is a plan view of the semiconductor device A1. FIG. 15 is a cross-sectional view taken along the line XV-XV shown in FIG. 14. FIG. 16 is a cross-sectional view taken along the line XVI-XVI shown in FIG. 14. In FIG. 14, the sealing resin 5 is shown in a see-through manner. For the sake of ease of understanding, the thickness direction of the semiconductor device A1 will be defined as a first direction z, the up down direction in the plan view (FIG. 14) that is perpendicular to the first direction z will be defined as a second direction x, and the right left direction in the plan view (FIG. 14) that is perpendicular to both the first direction z and the second direction x will be defined as a third direction y. The term "up" or "down" in the following description is used merely for the sake of description, and thus is not intended to limit the installation orientation of the semiconductor device A1 of the present disclosure.

The plurality of semiconductor elements 1 are circuit elements that are made of a semiconductor material and are electronic components that serve as an essential part for the functions of the semiconductor device A1. In the present embodiment, the semiconductor device A1 includes a first semiconductor element 11 and a second semiconductor element 12.

In the present embodiment, the first semiconductor element 11 is an IGBT (insulated gate bipolar transistor). The first semiconductor element 11 may be any other transistor such as a MOSFET (metal oxide semiconductor field effect transistor). The first semiconductor element 11 is rectangular in shape as viewed in the thickness direction (as viewed in the first direction z). As shown in FIG. 15, the first semiconductor element 11 includes a first semiconductor element main surface 111 and a first semiconductor element back surface 112.

The first semiconductor element main surface 111 is an upper surface of the first semiconductor element 11. The first semiconductor element back surface 112 is a lower surface of the first semiconductor element 11. The first semiconductor element main surface 111 and the first semiconductor element back surface 112 face opposite sides to each other in the first direction z.

Portions of the first semiconductor element main surface 111 are a first electrode pad 113 and a second electrode pad 114. The first electrode pad 113 is smaller in area than the second electrode pad 114. In the present embodiment, the first electrode pad 113 serves as a gate electrode of the IGBT, and the second electrode pad 114 serves as an emitter electrode of the IGBT. Also, a main portion of the first semiconductor element back surface 112 is a third electrode pad 115. In the present embodiment, the third electrode pad 115 serves as a collector electrode of the IGBT.

In the present embodiment, the second semiconductor element 12 is a diode. The second semiconductor element 12 is rectangular in shape as viewed in the thickness direction (as viewed in the first direction z). As shown in FIG. 15, the second semiconductor element 12 has a second semiconductor element main surface 121 and a second semiconductor element back surface 122.

The second semiconductor element main surface 121 is an upper surface of the second semiconductor element 12. The second semiconductor element back surface 122 is a lower surface of the second semiconductor element 12. The second semiconductor element main surface 121 and the second semiconductor element back surface 122 face opposite sides to each other in the first direction z.

The second semiconductor element main surface 121 serves as a main surface electrode pad 123. In the present embodiment, the main surface electrode pad 123 serves as an anode electrode of the above-described diode. Also, the second semiconductor element back surface 122 serves as a back surface electrode pad 124. In the present embodiment, the back surface electrode pad 124 serves as a cathode electrode of the above-described diode.

The lead frame 2 is an electrically conductive member, and constitutes a conduction path between the semiconductor device A1 and an electric circuit board by being bonded to the electric circuit board. The lead frame 2 is made of an alloy composed mainly of Cu. A portion of the surface may be surface-treated (for example, plated) in consideration of corrosion resistance, electroconductivity, thermal conductivity, bondability and the like. The lead frame 2 may correspond to the "external electrode". The lead frame 2 includes a first lead 21, a second lead 22, and a third lead 23.

The first lead 21 includes a first pad 211 (die pad), a first terminal 212, and an intermediate joint portion 213.

The first pad 211 has a pad main surface 211a and a pad back surface 211b. The pad main surface 211a is an upper surface of the first pad 211. The pad main surface 211a is a surface on which the first semiconductor element 11 and the second semiconductor element 12 are mounted, and as shown in FIG. 15, the first semiconductor element back surface 112 and the second semiconductor element back surface 122 face the pad main surface 211a. The pad back surface 211b is a lower surface of the first pad 211. The pad main surface 211a and the pad back surface 211b are both flat, and face opposite sides to each other in the first direction z.

The first pad 211 has a pad through hole 211c formed therein, the pad through hole 211c extending from the pad main surface 211a to the pad back surface 211b. The pad through hole 211c is spaced apart from the first semiconductor element 11 and the second semiconductor element 12 as viewed in the thickness direction. In the present embodiment, the pad through hole 211c has a circular shape as viewed in the thickness direction, but the shape is not limited thereto.

As shown in FIGS. 12 to 14, the first terminal 212 is a portion that extends along the second direction x and is partially exposed from the sealing resin 5. The first terminal 212 is in electrical conduction with the third electrode pad 115 via the intermediate joint portion 213, the first pad 211, and the first solder 31. As described above, the third electrode pad 115 serves as the collector electrode, and thus the first terminal 212 serves as a collector terminal of the semiconductor device A1.

As shown in FIGS. 13 and 14, the intermediate joint portion 213 is a portion that joins the first pad 211 and the first terminal 212. As shown in FIG. 16, in the first direction z, the first pad 211 and the first terminal 212 are provided in different positions, specifically, the first pad 211 is provided in a position lower than the first terminal 212 in FIG. 16. Accordingly, the intermediate joint portion 213 is inclined with respect to the first pad 211 and the first terminal 212. The intermediate joint portion 213 is entirely covered with the sealing resin 5.

As shown in FIGS. 12 to 14, the second lead 22 is a member that is disposed spaced apart from the first lead 21 and extends along the second direction x. In the third direction y, the second lead 22 is located on one side of the first terminal 212. The second lead 22 includes a second pad 221 and a second terminal 222.

As shown in FIG. 14, the second pad 221 is a portion that has a length in the third direction y that is longer than that of the second terminal 222 and is entirely covered with the sealing resin 5. As shown in FIGS. 13 and 14, the first wire 41 is connected to the second pad 221.

As shown in FIGS. 12 to 14, the second terminal 222 is a portion that extends along the second direction x and is partially exposed from the sealing resin 5. The second terminal 222 is in electrical conduction with the first electrode pad 113 via the second pad 221 and the first wire 41. In the present embodiment, as described above, the first electrode pad 113 serves as the gate electrode, and thus the second terminal 222 is a gate terminal of the semiconductor device A1.

As shown in FIGS. 12 to 14, the third lead 23 is a member that is disposed spaced apart from the first lead 21 and the second lead 22 and extends along the second direction x. In the third direction y, the third lead 23 is located on an opposite side of the second lead 22 across the first terminal 212. The second wire 42 and the third wire 43 are connected to the third pad 231.

As shown in FIG. 14, the third pad 231 is a portion that has a length in the third direction y that is longer than that of the third pad 231 and is entirely covered with the sealing resin 5. As shown in FIGS. 13 and 14, the second wire 42 and the third wire 43 are connected to the third pad 231.

As shown in FIGS. 12 to 14, the third terminal 232 is a portion that extends along the second direction x and is partially exposed from the sealing resin 5. The third terminal 232 is in electrical conduction with the second electrode pad 114 via the third pad 231 and the second wire 42. In the present embodiment, as described above, the second electrode pad 114 serves as the emitter electrode, and thus the third terminal 232 serves as an emitter terminal of the semiconductor device A1. Also, the third terminal 232 is in electrical conduction with the main surface electrode pad 123 via the third pad 231 and the third wire 43.

The exposed portions of the first terminal 212, the second terminal 222, and the third terminal 232 that are exposed from the sealing resin 5 may be coated with a plating. As a result of coating the exposed portions with a plating, it is possible to improve corrosion resistance.

A plurality of solders 3 are bonding materials for bonding the semiconductor element 1 to the lead frame 2. In the present embodiment, the semiconductor device A1 includes a first solder 31 and a second solder 32.

As shown in FIGS. 13 and 15, the first solder 31 is a member that is provided between the first semiconductor element 11 and the first pad 211 of the first lead 21 and has electroconductivity. With the first solder 31, the first semiconductor element 11 is mounted on the first pad 211, and the electrical conduction between the third electrode pad 115 of the first semiconductor element 11 and the first lead 21 is thereby ensured.

As shown in FIGS. 13 and 15, the second solder 32 is a member that is provided between the second semiconductor element and the first pad 211 of the first lead 21 and has electroconductivity. With the second solder 32, the second semiconductor element 12 is mounted on the first pad 211, and the electrical conduction between the back surface electrode pad 124 of the second semiconductor element 12 and the first lead 21 is thereby ensured.

As described above, the third electrode pad 115 of the first semiconductor element 11 and the back surface electrode pad 124 of the second semiconductor element 12 are both in electrical conduction with the first lead 21, and thus the third electrode pad 115 of the first semiconductor element 11 and the back surface electrode pad 124 of the second semiconductor element 12 are electrically connected. Accordingly, the collector electrode of the first semiconductor element 11 and the cathode electrode of the second semiconductor element 12 are electrically connected.

The first solder 31 and the second solder 32 may be made of the same material or may be made of different materials. Preferably, the first solder 31 has a melting point higher than that of the second solder 32. With this configuration, it is possible to prevent re-melting of the first solder 31 when the second semiconductor element 12 is die bonded. Also, the thickness of the first solder 31 and the second solder 32 is, but is not specifically limited thereto, 70 μm or more. With this configuration, it is possible to suppress the occurrence of solder cracks in the first solder 31 and the second solder 32.

A plurality of wires 4 are used to connect the semiconductor element 1 and the lead frame 2. In the present embodiment, the wires include a first wire 41, a second wire 42, and a third wire 43. The wires 4 are linear members that are made of the same metal and have electroconductivity. In the present embodiment, the wires 4 are made of an Al (aluminum) alloy containing Fe (iron) as an additional element. In the present embodiment, the wires 4 have a diameter of 400 μm to 500 μm. Also, in the present embodiment, the wires 4 have a Vickers hardness of 22.0 to 26.0. The value of Vickers hardness of the wires 4 will be described later in detail. The wires 4 have an average crystal grain size of 3 μm to 15 μm based on a relationship shown in FIG. 17. The average crystal grain size is measured by a known method. For example, a wire 4 is cut in a direction perpendicular to a lengthwise direction (major axis direction) of the wire, and the cut surface is captured with a microscope. Then, a straight line is drawn on the cut surface, and the number of crystal grains on the straight line is measured. After that, the length of the straight line is divided by the number of crystal grains measured so as to calculate the average crystal grain size. In the present embodiment, the wires 4 are configured to have an average crystal grain size of 3 μm to 15 μm by adjusting the amount of iron added (iron content).

Figure 17:
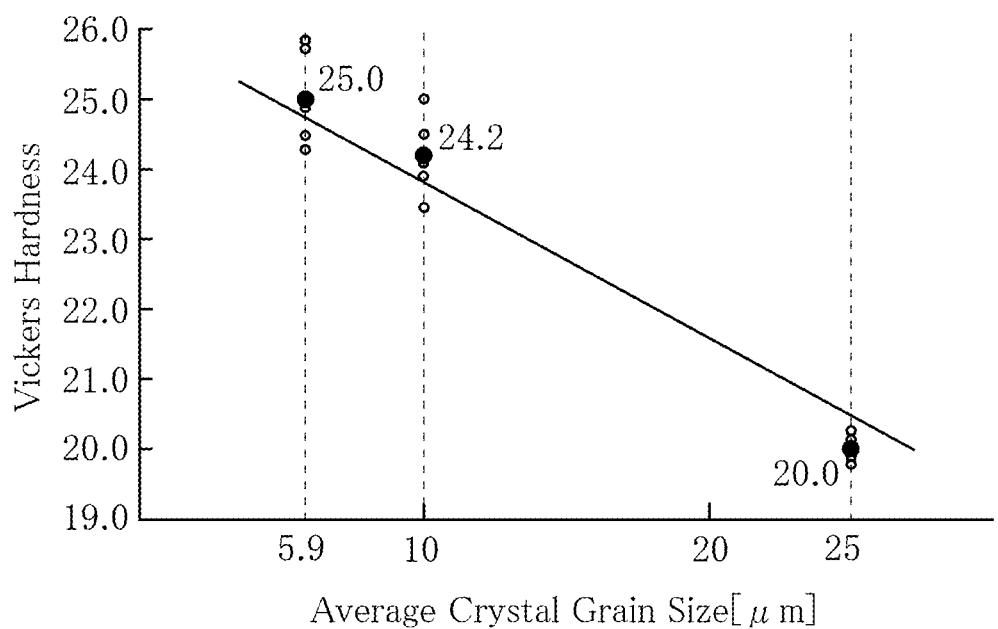
FIG. 17 is a diagram showing a relationship between average crystal grain size and Vickers hardness of wires.

FIG. 17 shows a relationship between average crystal grain size and Vickers hardness of wires 4 (aluminum). In FIG. 17, Vickers hardness measurement was performed several times on wires 4 having the same average crystal grain size (the results are indicated by small white circles), and the average value thereof (indicated by a large black circle) is defined as Vickers hardness with respect to the average crystal grain size. The Vickers hardness was measured by a known measurement method. As a result, in the case of wires 4 having an average crystal grain size of 25 μm, the Vickers hardness was 20.0. In the case of wires 4 having an average crystal grain size of 10 μm, the Vickers hardness was 24.2. In the case of wires 4 having an average crystal grain size of 5.9 μm, the Vickers hardness was 25.0. When they are, for example, root-mean-square fitted, a relationship is obtained in which a greater average crystal grain size results in a lower Vickers hardness, and a smaller average crystal grain size results in a higher Vickers hardness. Accordingly, as described above, in the case where the wires 4 have a Vickers hardness of 22.0 to 26.0, it can be seen that, based on the relationship shown in FIG. 17, the average crystal grain size of the wires 4 is 3 μm to 15 μm.

As shown in FIGS. 13 and 14, one end of the first wire 41 is bonded to the second pad 221 and the other end is bonded to the first electrode pad 113 of the first semiconductor element main surface 111. Accordingly, the first wire 41 provides electrical conduction between the second pad 221 and the first electrode pad 113.

As shown in FIGS. 13 and 14, one end of the second wire 42 is bonded to the third pad 231 and the other end is bonded to the second electrode pad 114 of the first semiconductor element main surface 111. Accordingly, the second wire 42 provides electrical conduction between the third pad 231 and the second electrode pad 114.

As shown in FIGS. 13 and 14, one end of the third wire 43 is bonded to the third pad 231 and the other end is bonded to the main surface electrode pad 123 of the second semiconductor element main surface 121. The third wire 43 provides electrical conduction between the third pad 231 and the main surface electrode pad 123.

The first wire 41, the second wire 42, and the third wire 43 are bonded to the above-described predetermined positions by a known wire bonding technique. The wire bonding technique may be, for example, a wire bonding technique that uses ultrasonic waves.

The third pad 231 is in electrical conduction with the second electrode pad 114, or in other words, the emitter electrode of the first semiconductor element 11 via the second wire 42, and the third pad 231 is in electrical conduction with the main surface electrode pad 123, or in other words, the anode electrode of the second semiconductor element 12 via the third wire 43. Accordingly, the emitter electrode of the first semiconductor element 11 and the anode electrode of the second semiconductor element 12 are electrically connected. Because the emitter electrode of the first semiconductor element 11 and the anode electrode of the second semiconductor element 12 are electrically connected, and also as described above, the collector electrode of the first semiconductor element 11 and the cathode electrode of the second semiconductor element 12 are electrically connected, the first semiconductor element 11 and the second semiconductor element 12 are connected in anti-parallel. With this configuration, the application of a reverse voltage to the first semiconductor element 11 is suppressed.

The sealing resin 5 is a member that convers a portion of the lead frame 2, as well as the first semiconductor element 11, the second semiconductor element 12, the first wire 41, the second wire 42, and the third wire 43. The sealing resin 5 is an electrically insulative thermosetting synthetic resin.

In the present embodiment, the sealing resin 5 is a black epoxy resin. The linear expansion coefficient of the sealing resin 5 is −45% to +45% of the linear expansion coefficient of the wires 4. To be specific, in the present embodiment, the wires 4 are made of an aluminum alloy and have a linear expansion coefficient of about 23.0, and thus the linear expansion coefficient of the sealing resin 5 is 12.65 to 33.35.

The sealing resin 5 has a resin main surface 51, a resin back surface 52, a pair of resin first side surfaces 53, and a pair of resin second side surfaces 54.

The resin main surface 51 is an upper surface of the sealing resin 5 shown in FIGS. 15 and 16. The resin back surface 52 is a lower surface of the sealing resin 5 shown in FIGS. 15 and 16. The resin main surface 51 and the resin back surface 52 face opposite sides to each other in the first direction z.

As shown in FIG. 16, the pair of resin first side surfaces 53 are surfaces that are formed so as to be spaced apart from each other in the second direction x. The pair of resin first side surfaces 53 face opposite sides to each other in the second direction x. Upper ends of the resin first side surfaces 53 shown in FIG. 16 join the resin main surface 51, and lower ends of the resin first side surfaces 53 shown in FIG. 16 join the resin back surface 52. In the present embodiment, the first lead 21 (the first terminal 212), the second lead 22 (the second terminal 222), and the third lead 23 (the third terminal 232) are partially exposed from one of the resin first side surface 53.

As shown in FIG. 15, the pair of resin second side surfaces 54 are surfaces that are formed so as to be spaced apart from each other in the third direction y. The pair of resin second side surfaces 54 face opposite sides to each other in the third direction y. Upper ends of the resin second side surfaces 54 shown in FIG. 15 join the resin main surface 51, and lower ends of the resin second side surfaces 54 shown in FIG. 15 join the resin back surface 52.

The sealing resin 5 has a pair of recessed portions 55 formed therein, the pair of recessed portions 55 being recessed from top portions of the pair of resin second side surfaces 54 shown in FIG. 12 into the inside of the sealing resin 5. Also, as shown in FIGS. 12 and 16, in the first direction z, the sealing resin 5 has a resin through hole 56 formed therein, the resin through hole 56 extending from the resin main surface 51 to the resin back surface 52. In the present embodiment, as viewed in the first direction z, the resin through hole 56 has a center that is coaxial with that of the pad through hole 211c. Also, the resin through hole 56 has a diameter smaller than that of the pad through hole 211c. In the present embodiment, the hole wall of the pad through hole 211c is entirely covered with the sealing resin 5. Although illustration is omitted, a member having a heat dissipating function such as a heat spreader may be provided by inserting a fastening member such as a screw into the resin through hole 56 so as to improve heat dissipation performance.

Next, the value of Vickers hardness of the wires 4 according to the embodiment of the present disclosure will be described in detail.

FIGS. 18A to 18C, FIGS. 19A to 19C, and FIGS. 20A to 20C show relationships between the Vickers hardness of the wires 4 and various types of resistance during temperature cycles. In the diagrams, the horizontal axis indicates Vickers hardness, and the vertical axis indicates the number of cycles in a temperature cycle test (TCT). The temperature cycle test is a reliability evaluation test for testing the influence of the repetition of temperature changes on the components and the product.

Figure 18A:
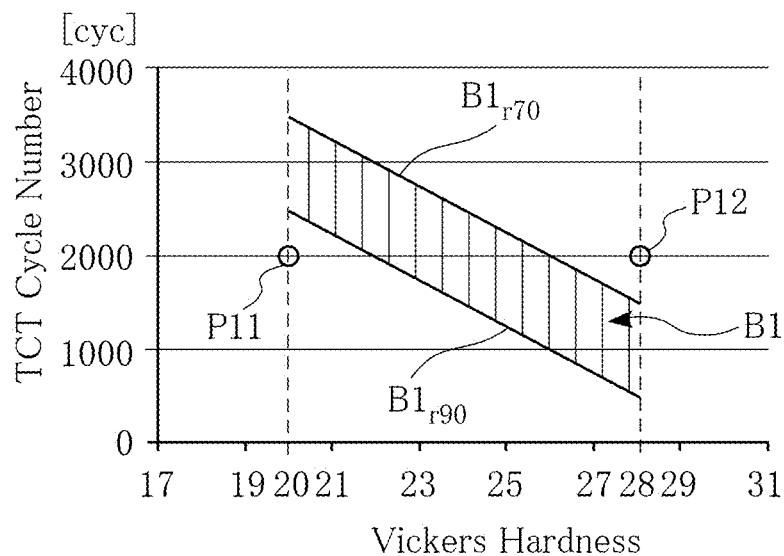
FIGS. 18A to 18C are diagrams illustrating a relationship between Vickers hardness and bonding strength resistance.
Figure 18B:
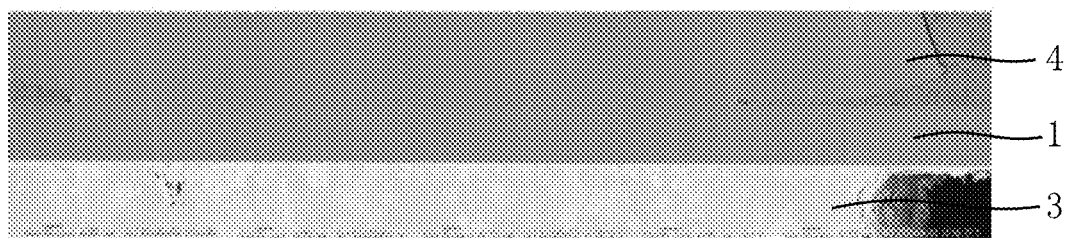
Figure 18C:
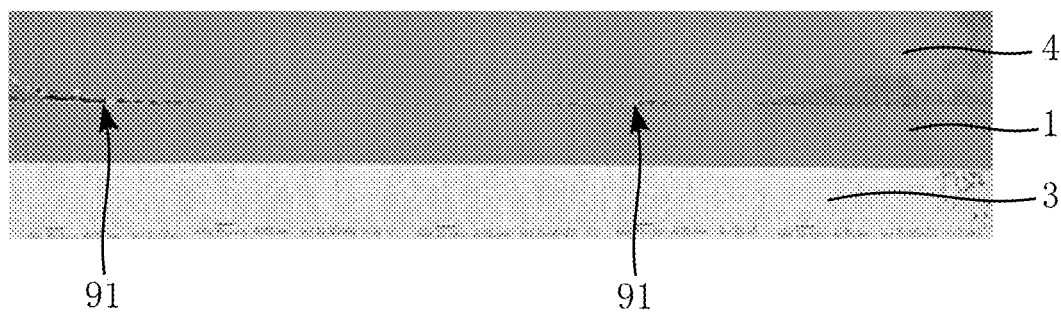

FIGS. 18A to 18C are diagrams illustrating a relationship between the Vickers hardness of a wire 4 and bonding strength resistance of the bonding surface between the wire 4 and the semiconductor element 1 with respect to temperature cycles.

In FIG. 18A, limit cycle number for bonding strength is used as a measure of bonding strength resistance, and a change in the limit cycle number for bonding strength with respect to a change in the Vickers hardness is shown. The limit cycle number for bonding strength indicates a boundary where the bonding strength of the bonding surface after the temperature cycle test does not satisfy the required quality and it is determined that the bonding strength is insufficient. The limit cycle number for bonding strength is obtained from the number of cycles at which the ratio of the bonding strength after the temperature cycle test with respect to the bonding strength before the temperature cycle test is a predetermined ratio (hereinafter referred to as "bonding strength ratio") or less.

The bonding strength ratio is determined based on the required quality, and can be, for example, 70% to 90%. The highest standard of required quality is obtained if the bonding strength ratio is set to 90%, and in FIG. 18A, the limit cycle number for bonding strength changes as indicated by a lower line $B1_{r90}$. If, on the other hand, the bonding strength ratio is set to 70%, the lowest standard of required quality is obtained, and the limit cycle number for bonding strength changes as indicated by an upper line $B1_{r70}$. The limit cycle number for bonding strength changes according to the bonding strength ratio and forms a strip-shaped region B1, and when the temperature cycle number is within the region B1, it may be determined that the bonding strength is insufficient.

FIGS. 18B and 18C are cross-sectional images obtained by capturing a cross section of the bonding surface with a microscope. FIG. 18B is a cross-sectional image obtained when a wire 4 having a Vickers hardness of 20.0 was used and a temperature cycle test of 2000 cycles was performed (point P11). FIG. 18C is a cross-sectional image obtained when a wire 4 having a Vickers hardness of 28.0 was used and a temperature cycle test of 2000 cycles was performed (point P12). In FIGS. 18B and 18C, the semiconductor element 1 is bonded on the lead frame 2 (not shown) with a solder 3, and the wire 4 is bonded to a surface (upper surface in the diagram) opposite to the surface on which the semiconductor element 1 is bonded with the solder 3. In the case of the wire 4 having a Vickers hardness of 20.0, even when a temperature cycle test of 2000 cycles was performed, as shown in FIG. 18B, almost no cracks 91 were found in the bonding surface between the wire 4 and the semiconductor element 1. On the other hand, in the case of the wire 4 having a Vickers hardness of 28.0, when a temperature cycle test of 2000 cycles was performed, as shown in FIG. 18C, a large number of cracks 91 were found in the bonding surface between the wire 4 and the semiconductor element 1. Accordingly, even when the number of cycles is the same in the temperature cycle tests, the higher Vickers hardness of the wire 4 results in increased occurrence of cracks 91. The cracks 91 deteriorate the bonding strength and cause peeling of the wire 4 and the like. From the foregoing, it can be seen that the higher the Vickers hardness of the wire 4, the lower the limit cycle number for bonding strength, and the bonding strength resistance with respect to the temperature cycle test is low. That is, the Vickers hardness and the bonding strength resistance have a correlation (first correlation), and the first correlation is a negative correlation.

Figure 19A:
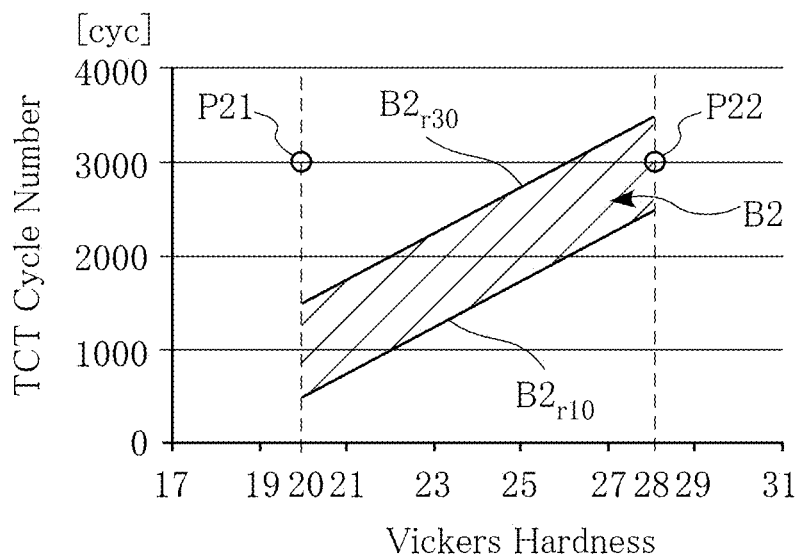
FIGS. 19A to 19C are diagrams illustrating a relationship between Vickers hardness and pitting corrosion resistance.
Figure 19B:
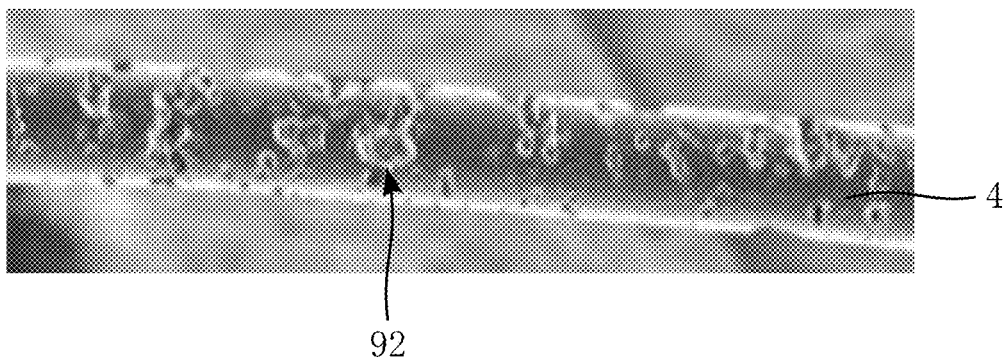
Figure 19C:
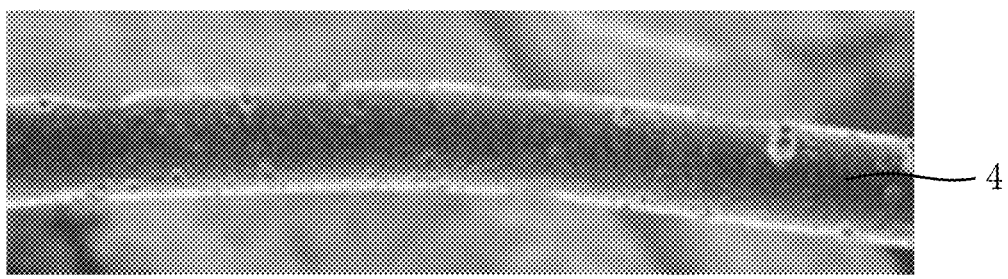

FIGS. 19A to 19C are diagrams illustrating a relationship between the Vickers hardness of a wire 4 and pitting corrosion resistance of the wire 4 with respect to temperature cycles. As used herein, "pitting corrosion" refers to corrosion in the form of holes that locally occurs in a wire 4.

In FIG. 19A, limit cycle number for pitting corrosion is used as a measure of pitting corrosion resistance, and a change in the limit cycle number for pitting corrosion with respect to a change in the Vickers hardness is shown. The limit cycle number for pitting corrosion indicates a boundary where the degree of pitting corrosion of the wire after the temperature cycle test does not satisfy the required quality and it is determined that a defect due to pitting corrosion has occurred. The limit cycle number for pitting corrosion is obtained from the number of cycles at which the ratio of the degree of pitting corrosion after the temperature cycle test with respect to the degree of pitting corrosion before the temperature cycle test is a predetermined ratio (hereinafter referred to as "pitting corrosion ratio") or more. The degree of pitting corrosion is determined based on, for example, the number or amount of pitting corrosion, occupation area, occupation ratio or the like, and the pitting corrosion ratio is determined based on the required quality, and can be, for example, 10% to 30%. The highest standard of required quality is obtained if the pitting corrosion ratio is set to 10%, and in FIG. 19A, the limit cycle number for pitting corrosion changes as indicated by a lower line $B2_{r10}$. If, on the other hand, the pitting corrosion ratio is set to 30%, the lowest standard of required quality is obtained, and the limit cycle number for pitting corrosion changes as indicated by an upper line $B2_{r70}$. The limit cycle number for pitting corrosion changes according to the pitting corrosion ratio and forms a strip-shaped region B2, and when the temperature cycle number is within the region B2, it may be determined that a defect due to pitting corrosion has occurred.

FIGS. 19B and 19C are images obtained by capturing wires 4 with a microscope. FIG. 19B is an image obtained when a wire 4 having a Vickers hardness of 20.0 was used and a temperature cycle test of 3000 cycles was performed (point P21). FIG. 19C is an image obtained when a wire 4 having a Vickers hardness of 28.0 was used and a temperature cycle test of 3000 cycles was performed (point P22). In the case of the wire 4 having a Vickers hardness of 20.0, when a temperature cycle test of 3000 cycles was performed, as shown in FIG. 19B, a large number of pitting corrosion spots 92 were found. On the other hand, in the case of the wire 4 having a Vickers hardness of 28.0, even when a temperature cycle test of 3000 cycles was performed, almost no pitting corrosion 92 was found. Accordingly, even when the number of cycles is the same in the temperature cycle tests, the occurrence of pitting corrosion 92 is suppressed more as the Vickers hardness of the wire 4 is higher. The pitting corrosion 92 deteriorates the rupture strength of the wire, and causes rupture of the wire 4 and the like. From the foregoing, it can be seen that the higher the Vickers hardness of the wire 4, the higher the limit cycle number for pitting corrosion, and the pitting corrosion resistance with respect to the temperature cycle test is high. That is, the Vickers hardness and the pitting corrosion resistance have a correlation (second correlation), and the second correlation is a positive correlation.

Figure 20A:
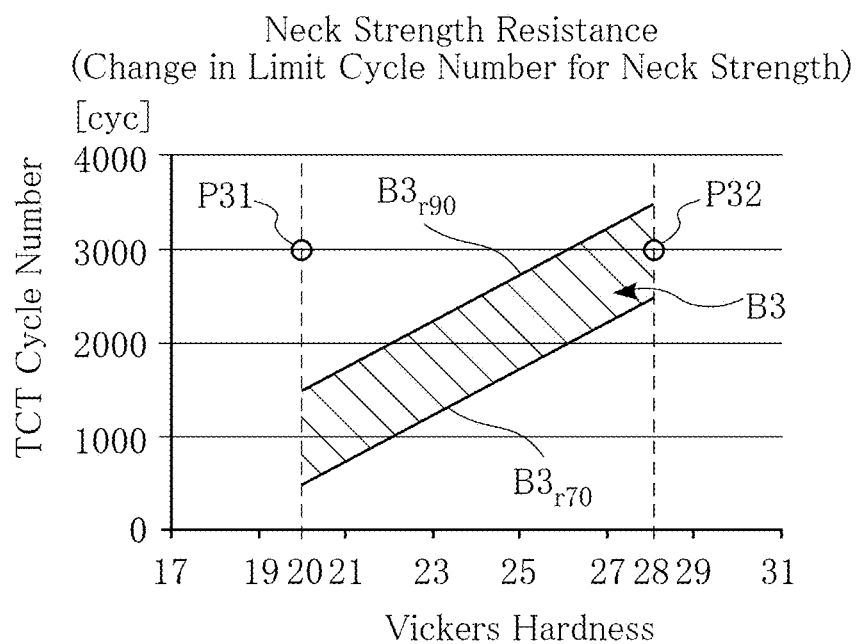
FIGS. 20A to 20C are diagrams illustrating a relationship between Vickers hardness and neck strength resistance.
Figure 20B:
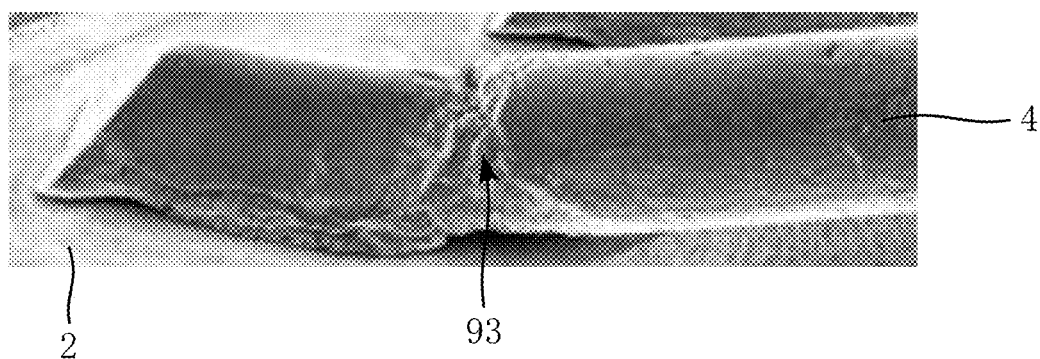
Figure 20C:
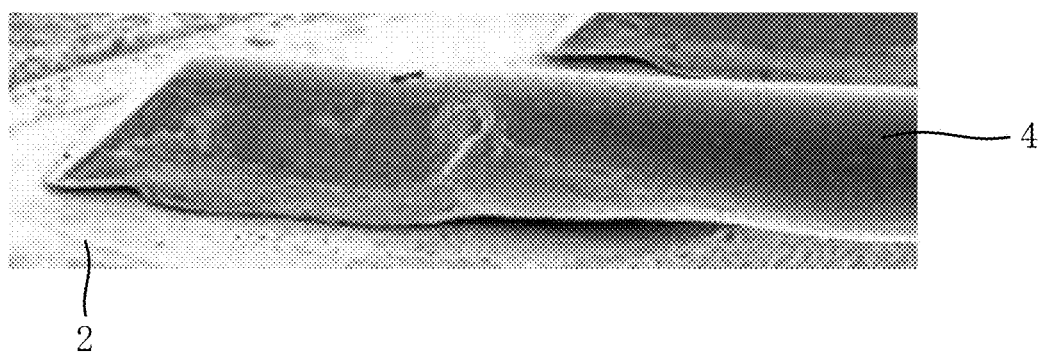

FIGS. 20A to 20C are diagrams illustrating a relationship between the Vickers hardness of a wire 4 and neck strength resistance of the bonding portion (neck portion) between the wire 4 and an external electrode (lead frame 2) with respect to temperature cycles.

In FIG. 20A, limit cycle number for neck strength is used as a measure of neck strength resistance, and a change in limit cycle number for neck strength with respect to a change in the Vickers hardness is shown. The limit cycle number for neck strength indicates a boundary where the bonding strength (neck strength) of the neck portion after the temperature cycle test does not satisfy the required quality and it is determined that the neck strength is insufficient. The limit cycle number for neck strength is obtained from the number of cycles at which the ratio of the neck strength after the temperature cycle test with respect to the neck strength before the temperature cycle test is a predetermined ratio (hereinafter referred to as "neck strength ratio") or less. The neck strength ratio is determined based on the required quality, and can be, for example, 70% to 90%. The highest standard of required quality is obtained if the neck strength ratio is set to 90, and in FIG. 20A, the limit cycle number for neck strength changes as indicated by a lower line $B3_{r90}$. If, on the other hand, the neck strength ratio is set to 70%, the lowest standard of required quality is obtained, and the limit cycle number for neck strength changes as indicated by an upper line $B3_{r70}$. The limit cycle number for neck strength changes according to the neck strength ratio and forms a strip-shaped region B3, and when the temperature cycle number is within the region B3, it may be determined that the neck strength is insufficient.

FIGS. 20B and 20C are images obtained by capturing the neck portion with a microscope. FIG. 20B is an image obtained when a wire 4 having a Vickers hardness of 20.0 was used and a temperature cycle test of 3000 cycles was performed (point P31). FIG. 20C is an image obtained when a wire 4 having a Vickers hardness of 28.0 was used and a temperature cycle test of 3000 cycles was performed (point P32). In the case of the wire 4 having a Vickers hardness of 20.0, when a temperature cycle test of 3000 cycles was performed, as shown in FIG. 20B, damage 93 was found in the neck portion. On the other hand, in the case of the wire 4 having a Vickers hardness of 28.0, even when a temperature cycle test of 3000 cycles was performed, almost no damage 93 was found. Accordingly, even when the number of cycles is the same in the temperature cycle tests, the occurrence of damage 93 is suppressed more as the Vickers hardness of the wires 4 is higher. The damage 93 deteriorates the bonding strength of the neck portion and causes disconnection of the wire 4 at the neck portion, peeling of the wire 4 and the like. From the foregoing, it can be seen that the higher the Vickers hardness of the wire 4, the higher the limit cycle number for neck strength, and the neck strength resistance with respect to the temperature cycle test is high. That is, the Vickers hardness and the neck strength resistance have a correlation (third correlation), and the third correlation is a positive correlation.

Figure 21:
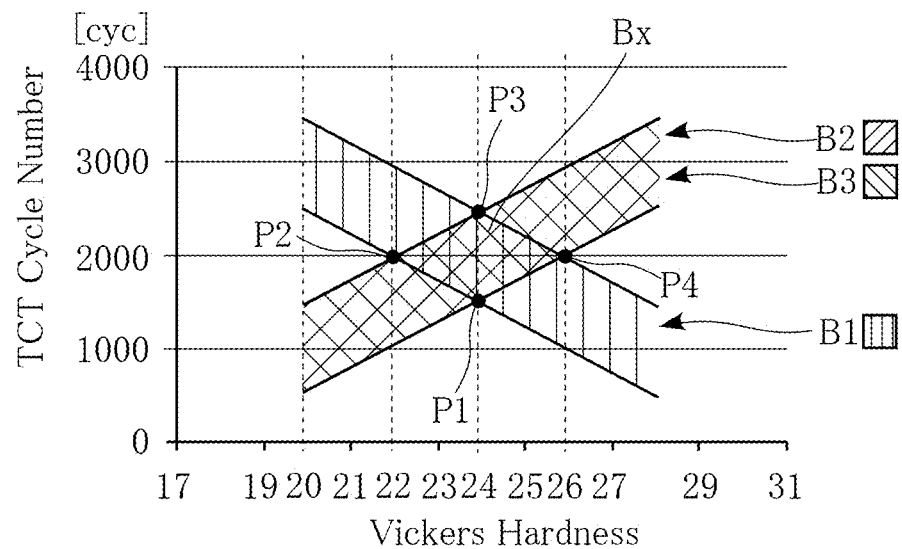
FIG. 21 is a diagram illustrating the Vickers hardness of wires according to the present disclosure.

FIG. 21 is a graph obtained by superposing FIGS. 18A, 19A and 20A. As in FIGS. 18A, 19A and 20A, the region B1 where the limit cycle number for bonding strength changes when the bonding strength ratio was set to 70 to 90%, the region B2 where the limit cycle number for pitting corrosion changes when the pitting corrosion ratio was set to 10 to 30%, and the region B3 where the limit cycle number for neck strength changes when the neck strength ratio was set to 70 to 90% are shown. There is an overlap between the region B2 where the limit cycle number for pitting corrosion changes and the region B3 where the limit cycle number for neck strength changes.

In FIG. 21, the Vickers hardness of the wire 4 according to the present embodiment is set to a value corresponding to an overlapping region Bx where the region B1 where the limit cycle number for bonding strength changes, the region B2 where the limit cycle number for pitting corrosion changes, and the region B3 where the limit cycle number for neck strength changes overlap with each other.

For example, when higher standards are set by, for example, setting the bonding strength ratio to 90%, the pitting corrosion ratio to 10%, and the neck strength ratio to 90%, the Vickers hardness (hereinafter referred to as "optimum Vickers hardness") at which the highest reliability for temperature cycle of the semiconductor device A1 is obtained is 24.0 based on FIG. 21. At this time, the resistance with respect to the temperature cycle test of the semiconductor device A1 is about 1500 cycles as indicated by point P1 in FIG. 21.

Figure 22:
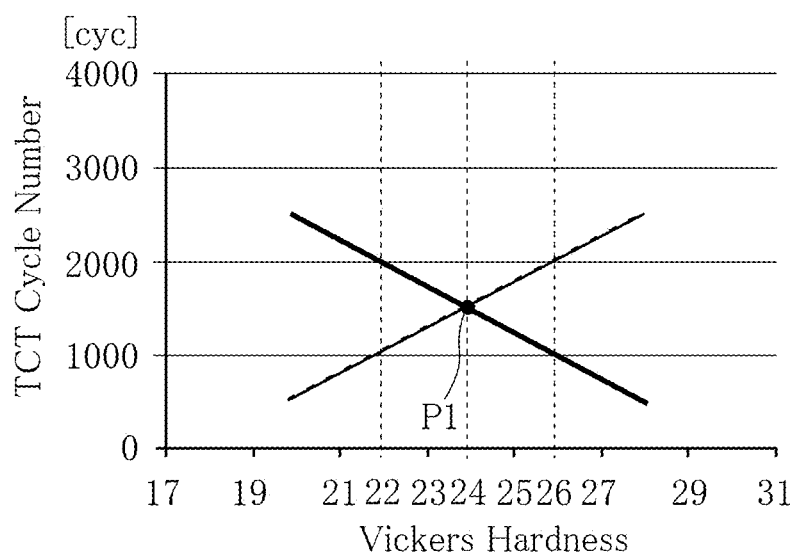
FIG. 22 is a diagram illustrating how to determine a Vickers hardness at which the highest reliability of the semiconductor device in a temperature cycle test is obtained.
Figure 23A:
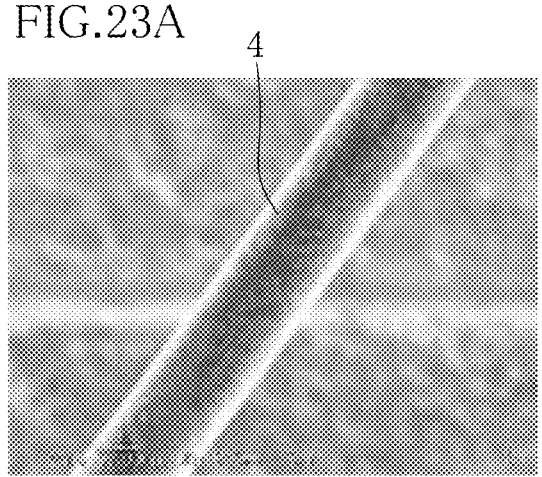
FIGS. 23A to 23D are enlarged microscopic images of a wire when the linear expansion coefficient of sealing resin is changed with respect to the linear expansion coefficient of the wire.
Figure 23B:
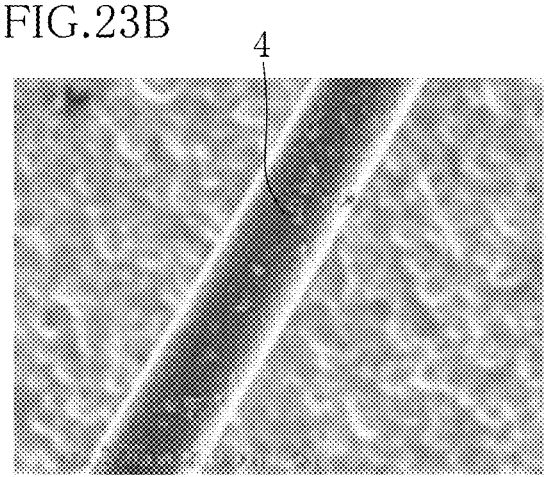
Figure 23C:
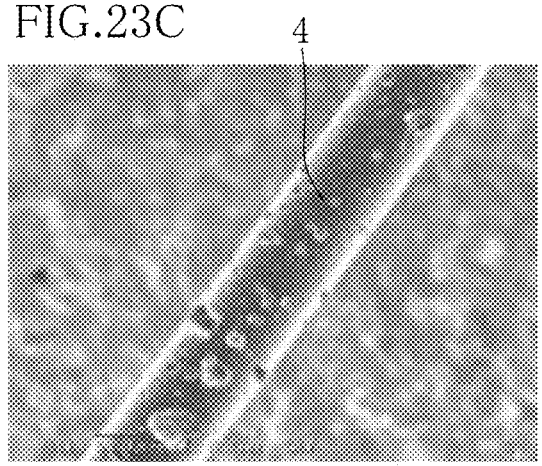
Figure 23D:
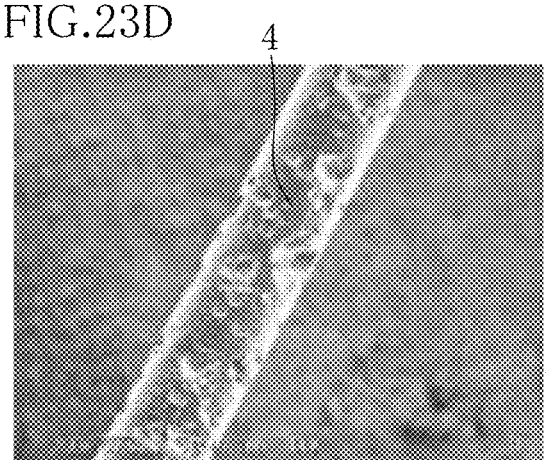

FIG. 22 is a diagram illustrating how to determine the optimum Vickers hardness. In FIG. 22, the change in limit cycle number for bonding strength when the bonding strength ratio was set to 90% is indicated by a thick line, the change in limit cycle number for pitting corrosion when the pitting corrosion ratio was set to 10% is indicated by a thin line, and the change in limit cycle number for neck strength when the neck strength ratio was set to 90% is indicated by a broken line. Although the change in limit cycle number for pitting corrosion and the change in limit cycle number for neck strength overlap with each other, but they are illustrated with a slight offset. In the diagram, for example, when the Vickers hardness is 22.0, the limit cycle number for bonding strength is 2000 cycles, but the limit cycle number for pitting corrosion and the limit cycle number for neck strength are 1000 cycles. Accordingly, the resistance cycle number with respect to the temperature cycle test of the semiconductor device A1 is 1000 cycles. Also, when the Vickers hardness is 24.0, the limit cycle number for bonding strength, the limit cycle number for pitting corrosion and the limit cycle number for neck strength are all 1500 cycles. Accordingly, the resistance cycle number with respect to the temperature cycle test of the semiconductor device A1 is 1500 cycles. Likewise, when the Vickers hardness is 26.0, the limit cycle number for pitting corrosion and the limit cycle number for neck strength are 2000 cycles, but the limit cycle number for bonding strength is 1000 cycles. Accordingly, the resistance cycle number with respect to the temperature cycle test of the semiconductor device A1 is 1000 cycles. From the foregoing, it can be said that the resistance cycle number with respect to the temperature cycle test of the semiconductor device A1 is highest, or in other words, the reliability is highest when the Vickers hardness is 24.0. That is, the optimum Vickers hardness is 24.0.

Referring back to FIG. 21, it can be seen that when the bonding strength ratio is set to 90% so as to set a higher standard by changing the pitting corrosion ratio and the neck strength ratio, and the pitting corrosion ratio is set to 30% and the neck strength ratio is set to 70% so as to set a lower standard, the resulting optimum Vickers hardness is 22.0. At this time, the resistance with respect to the temperature cycle test of the semiconductor device A1 is about 2000 cycles as indicated by point P2 in FIG. 21.

Furthermore, it can be seen that when lower standards are set by changing the bonding strength ratio to 70%, with the pitting corrosion ratio being set to 30% and the neck strength ratio being set to 70%, the resulting optimum Vickers hardness is 24.0. At this time, the resistance with respect to the temperature cycle test of the semiconductor device A1 is about 2500 cycles as indicated by point P3 in FIG. 21.

It can be also seen that when the bonding strength ratio is set to 70% so as to set a lower standard, and the pitting corrosion ratio is set to 10% and the neck strength ratio is set to 90% so as to set a higher standard, the resulting optimum Vickers hardness is 26.0. At this time, the resistance with respect to the temperature cycle test of the semiconductor device A1 is about 2000 cycles as indicated by point P4 in FIG. 21.

From the foregoing, it can be seen that when the bonding strength ratio is changed in the range of 70% to 90%, the pitting corrosion ratio is changed in the range of 10% to 30%, and the neck strength ratio is changed in the range of 70% to 90%, and the optimum Vickers hardness is obtained each time, as described above, the optimum Vickers hardness is a value corresponding to the region Bx in FIG. 21. Accordingly, in the present embodiment, the wires 4 are configured to have a Vickers hardness of 22.0 to 26.0.

According to the present embodiment, the average crystal grain size of the wires 4 is set to 3 µm to 15 µm, and the Vickers hardness of the wires 4 is set to 22.0 to 26.0. With this configuration, as shown in FIG. 21, in the semiconductor device A1 of the present disclosure, the resistance with respect to the temperature cycle test is about 1500 to 2500 cycles. On the other hand, in a conventional semiconductor device, the wires have an average crystal grain size of about 25 µm and a Vickers hardness of about 20.0. In the case of wires 4 having a Vickers hardness of 20.0, as shown in FIG. 21, in terms of bonding strength, the bonding strength resistance is high, and thus the wires 4 can withstand up to 2500 to 3500 cycles in the temperature cycle test, but in terms of pitting corrosion and neck strength, the pitting corrosion resistance and the neck strength resistance are low, and thus the wires 4 can withstand only up to 500 to 1500 cycles in the temperature cycle test. Accordingly, the conventional semiconductor device has a sufficient bonding strength when the number of cycles is 500 to 1500 cycles, but the pitting corrosion and the neck strength are insufficient. It is therefore determined that the product is defective. That is, the resistance (the resistance cycle number) with respect to the temperature cycle test of the conventional semiconductor device is 500 to 1500 cycles. From the above, the reliability for the temperature cycle of the semiconductor device A1 can be improved as compared with the conventional semiconductor device.

Also, according to the present embodiment, the linear expansion coefficient of the sealing resin 5 is set to −45% to 45% of the linear expansion coefficient of the wire 4. FIGS. 23A to 23D are images of wires 4 captured with a microscope when the linear expansion coefficient of the sealing resin 5 was changed with respect to the linear expansion coefficient of the wires 4, and FIGS. 23A to 23D show the cases where the linear expansion coefficient of the sealing resin 5 was set to 18, 13, 12, and 9, respectively. As shown in the images, it can be seen that pitting corrosion 92 that has occurred in the wire 4 increases in the order from FIGS. 23A to 23D. In the present embodiment, as described above, because the linear expansion coefficient of the wire 4 is 23, the occurrence of pitting corrosion 92 becomes more prominent as the difference increases between the linear expansion coefficient of the sealing resin 5 and the linear expansion coefficient of the wire 4. Accordingly, by setting the linear expansion coefficient of the sealing resin 5 to −45% to +45% of the linear expansion coefficient of the wire 4, the occurrence of pitting corrosion 92 can be suppressed. Also, as a result of the occurrence of pitting corrosion 92 being suppressed, it is also possible to improve the neck strength resistance. That is, the reliability for temperature cycle of the semiconductor device A1 can be further improved.

The embodiment given above has been described by taking an example in which the semiconductor device A1 includes the first semiconductor element 11 and the second semiconductor element 12, but the semiconductor device A1 may include only the first semiconductor element 11 or the second semiconductor element 12.

The embodiment given above has been described by taking an example in which the semiconductor device A1 having a lead frame structure is used, but can be applied to various types of semiconductor devices in which a semiconductor element and an external electrode are connected by using a wire 4.

The above disclosure encompasses embodiments according to the following Clauses.

[Clause B1]
A semiconductor device including:
a semiconductor element;
an external electrode; and
a wire that provides electrical conduction between the semiconductor element and the external electrode and has an average crystal grain size of 3 μm to 15 μm.

[Clause B2]
The semiconductor device according to Clause B1,
wherein the wire has a Vickers hardness of 22.0 to 26.0.

[Clause B3]
The semiconductor device according to Clause B2,
wherein the Vickers hardness and bonding strength resistance between the wire and the semiconductor element with respect to a temperature cycle test have a first correlation, and
the bonding strength resistance of the wire deteriorates as the Vickers hardness increases.

[Clause B4]
The semiconductor device according to Clause B3,
wherein the number of cycles at which a ratio of bonding strength between the wire and the semiconductor element after the temperature cycle test with respect to the bonding strength before the temperature cycle test is a predetermined bonding strength ratio or less is defined as limit cycle number for bonding strength, and
the higher the limit cycle number for bonding strength, the higher the bonding strength resistance.

[Clause B5]
The semiconductor device according to Clause B4,
wherein the bonding strength ratio is 70 to 90%.

[Clause B6]
The semiconductor device according to Clause B5,
wherein the Vickers hardness and pitting corrosion resistance of the wire after the temperature cycle test have a second correlation, and
the pitting corrosion resistance is improved more as the Vickers hardness increases.

[Clause B7]
The semiconductor device according to Clause B6,
wherein the number of cycles at which a ratio of a degree of pitting corrosion of the wire after the temperature cycle test with respect to the degree of pitting corrosion before the temperature cycle test is a predetermined pitting corrosion ratio or more is defined as limit cycle number for pitting corrosion, and
the higher the limit cycle number for pitting corrosion, the higher the pitting corrosion resistance.

[Clause B8]
The semiconductor device according to Clause B7,
wherein the pitting corrosion ratio is 10 to 30%.

[Clause B9]
The semiconductor device according to Clause B8,
wherein the Vickers hardness and neck strength resistance of a bonding portion between the wire and the external electrode after the temperature cycle test have a third correlation, and
the neck strength resistance is improved more as the Vickers hardness increases.

[Clause B10]
The semiconductor device according to Clause B9,
wherein the number of cycles at which a ratio of a neck strength of the bonding portion after the temperature cycle test with respect to the neck strength before the temperature cycle test is a predetermined neck strength ratio or less is defined as limit cycle number for neck strength, and
the higher the limit cycle number for neck strength, the higher the neck strength resistance.

[Clause B11]
The semiconductor device according to Clause B10,
wherein the neck strength ratio is 70 to 90%.

[Clause B12]
The semiconductor device according to Clause B11,
wherein the Vickers hardness is set based on the first to third correlations.

[Clause B13]
The semiconductor device according to any one of Clauses B1 to B12, further including a sealing resin that covers the semiconductor element and the wire.

[Clause B14]
The semiconductor device according to Clause B13,
wherein a linear expansion coefficient of the sealing resin is −45% to +45% of a linear expansion coefficient of the wire.

[Clause B15]
The semiconductor device according to Clause B14,
wherein the sealing resin is an epoxy resin.

[Clause B16]
The semiconductor device according to any one of Clauses B1 to B15,
wherein the wire is made of an aluminum alloy.

[Clause B17]
The semiconductor device according to Clause B16,
wherein the aluminum alloy contains iron in addition to aluminum.

[Clause B18]
The semiconductor device according to any one of Clauses B1 to B17,
wherein the semiconductor element is a transistor or a diode.

[Clause B19]
The semiconductor device according to any one of Clauses B1 to B18,
wherein the external electrode is a lead frame.

[Clause B20]

The semiconductor device according to Clause B19, wherein the lead frame includes a first lead on which the semiconductor element is mounted and a second lead that is connected to the semiconductor element by using the wire.

The semiconductor device and the method of manufacturing a semiconductor device according to the present disclosure are not limited to the embodiments given above. Specific configurations of constituent elements of the semiconductor device of the present disclosure and the process of the manufacturing method of the present disclosure can be designed and changed in various ways.

The invention claimed is:

1. A semiconductor device including:
   a lead frame including a first lead including a pad and a first terminal, the pad including a single continuous pad main surface and a pad back surface that face opposite sides to each other in a first direction, and the first terminal extending from the pad along a second direction that is perpendicular to the first direction;
   a first semiconductor element and a second semiconductor element, each of the first semiconductor element and the second semiconductor element having an element main surface and an element back surface that face opposite sides to each other in the first direction, and the element back surface of the first semiconductor element and the element back surface of the second semiconductor element facing the single continuous pad main surface,
   a first solder that is provided between the first semiconductor element and the single continuous pad main surface and provides conductive bonding between the first semiconductor element and the single continuous pad main surface;
   a second solder that is provided between the second semiconductor element and the single continuous pad main surface, provides conductive bonding between the second semiconductor element and the single continuous pad main surface, and has a melting point lower than a melting point of the first solder, wherein
   each of the first solder and the second solder is in direct contact with the single continuous pad main surface,
   the first solder and the second solder are spaced apart from each other via a gap in a third direction perpendicular to the first direction and the second direction,
   the first terminal has a center line extending along the second direction and passing through the gap as viewed in the first direction, and
   as viewed in the first direction, a distance between the second solder and the center line is greater than a distance between the first solder and the center line.

2. The semiconductor device according to claim 1, wherein the first solder and the second solder contain tin, and
   the first solder has a less tin content than a tin content of the second solder.

3. The semiconductor device according to claim 1, wherein the first solder has a melting point of 300 degrees Celsius to 340 degrees Celsius, and the second solder has a melting point of 280 degrees Celsius to 320 degrees Celsius.

4. The semiconductor device according to claim 1, wherein the second semiconductor element is smaller in dimension as viewed in the first direction than the first semiconductor element.

5. The semiconductor device according to claim 1, wherein the first solder has a dimension in the first direction of 70 μm to 150 μm.

6. The semiconductor device according to claim 5, wherein the first semiconductor element has a size of 1 mm to 10 mm square as viewed in the first direction.

7. The semiconductor device according to claim 6, wherein the first semiconductor element has a dimension in the first direction of 40 μm to 300 μm.

8. The semiconductor device according to claim 5, wherein the second solder has a dimension in the first direction of 70 μm to 150 μm.

9. The semiconductor device according to claim 8, wherein the second semiconductor element has a dimension in the first direction of 40 μm to 300 μum.

* * * * *